US012787248B2

(12) United States Patent
Tung et al.

(10) Patent No.: US 12,787,248 B2
(45) Date of Patent: Nov. 3, 2026

(54) MEMORY DEVICE AND MANUFACTURING METHOD THEREOF

(71) Applicant: Fujian Jinhua Integrated Circuit Co., Ltd., Quanzhou City (CN)

(72) Inventors: Yu-Cheng Tung, Quanzhou City (CN); Janbo Zhang, Quanzhou City (CN)

(73) Assignee: Fujian Jinhua Integrated Circuit Co., Ltd., Quanzhou City (CN)

( * ) Notice: Subject to any disclaimer, the term of this patent is extended or adjusted under 35 U.S.C. 154(b) by 402 days.

(21) Appl. No.: 18/380,669

(22) Filed: Oct. 17, 2023

(65) Prior Publication Data

US 2025/0089230 A1 Mar. 13, 2025

(30) Foreign Application Priority Data

Sep. 12, 2023 (CN) ......................... 202311170624.3

(51) Int. Cl.
*H10B 12/00* (2023.01)

(52) U.S. Cl.
CPC ........... *H10B 12/03* (2023.02); *H10B 12/482* (2023.02); *H10B 12/485* (2023.02); *H10B 12/488* (2023.02)

(58) Field of Classification Search
CPC .... H10B 12/03; H10B 12/482; H10B 12/485; H10B 12/488; H10B 12/0335; H10B 12/315; H10B 12/30; H10B 12/02
See application file for complete search history.

(56) References Cited

U.S. PATENT DOCUMENTS

| | | | | |
|---|---|---|---|---|
| 9,209,241 | B2 | 12/2015 | Kim | |
| 2009/0085083 | A1 | 4/2009 | Shin | |
| 2021/0066304 | A1* | 3/2021 | Kang | G11C 5/063 |
| 2021/0408004 | A1 | 12/2021 | Lee | |
| 2022/0173108 | A1* | 6/2022 | Lee | H10B 12/315 |
| 2023/0148354 | A1 | 5/2023 | Jin | |
| 2025/0227916 | A1 | 7/2025 | Kim | |

FOREIGN PATENT DOCUMENTS

| | | | |
|---|---|---|---|
| CN | 114156230 | A | 3/2022 |

* cited by examiner

*Primary Examiner* — Mohammed R Alam
(74) *Attorney, Agent, or Firm* — Winston Hsu

(57) ABSTRACT

A memory device and a manufacturing thereof are disclosed in the present invention. The memory device includes a substrate, a bit line contact opening, a bit line contact structure, and a first spacer. The bit line contact opening is at least partially disposed in the substrate, and the bit line contact opening includes a first portion, a second portion, and a third portion. The second portion located under and connected with the first portion. The third portion is located under t and connected with the second portion. The bit line contact structure is disposed in the first portion, the second portion, and the third portion of the bit line contact opening. The first spacer is disposed in the first portion of the bit line contact opening and surrounds the bit line contact structure.

17 Claims, 22 Drawing Sheets

MEMORY DEVICE AND MANUFACTURING METHOD THEREOF

BACKGROUND OF THE INVENTION

1. Field of the Invention

The present invention relates to a memory device and a manufacturing method thereof, and more particularly, to a memory device including portions with different width and a manufacturing method thereof.

2. Description of the Prior Art

Dynamic random access memory (DRAM) is a kind of volatile memory, which includes an array area composed of memory cells and a peripheral area composed of controlling circuits. Each of the memory cells is composed of a transistor and a capacitor connected with the transistor. Electric charge in the capacitor is controlled by the transistor for being released or stored so as to store information. The controlling circuit controls access to data of each memory cell via word lines (WL) and bit lines (BL) that span the array area and are electrically connected to each memory cell, which can be addressed to each memory cell. The distance between parts in the memory device becomes relatively small for reducing the size of memory cells and manufacturing chips with higher integrity. However, under this circumstance, the allowable misalignment range in the related processes becomes smaller, and that is not conducive to enhancing the production yield of the manufacturing method.

SUMMARY OF THE INVENTION

A memory device and a manufacturing method thereof are provided in the present invention. A bit line contact opening having different portions and a spacer disposed in the bit line contact opening are used to improve the influence of alignment shifts in the process of forming a bit line structure and a bit line contact structure on the production yield.

According to an embodiment of the present invention, a memory device is provided. The memory device includes a substrate, a bit line contact opening, a bit line contact structure, and a first spacer. The bit line contact opening is at least partially disposed in the substrate, and the bit line contact opening includes a first portion, a second portion, and a third portion. The second portion is located under the first portion and connected with the first portion, and the third portion is located under the second portion and connected with the second portion. The bit line contact structure is disposed in the first portion, the second portion, and the third portion of the bit line contact opening. The first spacer is disposed in the first portion of the bit line contact opening and surrounds the bit line contact structure.

According to an embodiment of the present invention, a manufacturing method of a memory device is provided. The manufacturing method includes the following steps. A substrate is provided. A first portion of a bit line contact opening is formed in the substrate, and a first spacer is formed in the first portion of the bit line contact opening. A second portion of the bit line contact opening is formed after the first spacer is formed, and the second portion is located under and connected with the first portion. A third portion of the bit line contact opening is formed after the second portion of the bit line contact opening is formed, and the third portion is located under and connected with the second portion. A bit line contact structure is formed in the bit line contact opening. The bit line contact structure is formed in the first portion, the second portion, and the third portion of the bit line contact opening, and the first spacer surrounds the bit line contact structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIGS. 1-11 are schematic drawings illustrating a manufacturing method of a memory device according to a first embodiment of the present invention, wherein FIG. 1 and FIG. 2 are cross-sectional schematic drawings taken in different directions, FIG. 3 is a schematic drawing in a step subsequent to FIG. 1, FIG. 4 is a schematic drawing in a step subsequent to FIG. 2, FIG. 5 is a schematic drawing in a step subsequent to FIG. 3, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a cross-sectional schematic drawing taken in another direction under the situation of FIG. 8, FIG. 10 is a schematic drawing in a step subsequent to FIG. 8, and FIG. 11 is a schematic drawing in a step subsequent to FIG. 9.

FIGS. 12-14 are schematic drawings illustrating a manufacturing method of a memory device according to a second embodiment of the present invention, wherein FIG. 13 is a schematic drawing in a step subsequent to FIG. 12, and FIG. 14 is a cross-sectional schematic drawing taken in another direction under the situation of FIG. 13.

FIGS. 15-18 are schematic drawings illustrating a manufacturing method of a memory device according to a third embodiment of the present invention, wherein FIG. 16 is a schematic drawing in a step subsequent to FIG. 15, FIG. 17 is a schematic drawing in a step subsequent to FIG. 16, and FIG. 18 is a cross-sectional schematic drawing taken in another direction under the situation of FIG. 17.

FIGS. 19-24 are schematic drawings illustrating a manufacturing method of a memory device according to a fourth embodiment of the present invention, wherein FIG. 20 is a schematic drawing in a step subsequent to FIG. 19, FIG. 21 is a schematic drawing in a step subsequent to FIG. 20, FIG. 22 is a schematic drawing in a step subsequent to FIG. 21, FIG. 23 is a schematic drawing in a step subsequent to FIG. 22, and FIG. 24 is a cross-sectional schematic drawing taken in another direction under the situation of FIG. 23.

FIGS. 25-27 are schematic drawings illustrating a manufacturing method of a memory device according to a fifth embodiment of the present invention, wherein FIG. 26 is a schematic drawing in a step subsequent to FIG. 25, and FIG. 27 is a cross-sectional schematic drawing taken in another direction under the situation of FIG. 26.

DETAILED DESCRIPTION

To provide a better understanding of the presented invention for those skilled in the technical field of the present invention, several preferred embodiments of the present invention are enumerated below, together with the accompanying drawings, to describe the technical solutions and desired effects of the present invention in detail. Those skilled in the art may refer to the following embodiments and replace, reorganize, and mix features in several different embodiments to complete other embodiments without departing from the spirit of the present invention.

The term “forming” or the term “disposing” are used hereinafter to describe the behavior of applying a layer of material to the substrate. Such terms are intended to describe any possible layer forming techniques including, but not limited to, thermal growth, sputtering, evaporation, chemical vapor deposition, epitaxial growth, electroplating, and the like.

Figure 10:
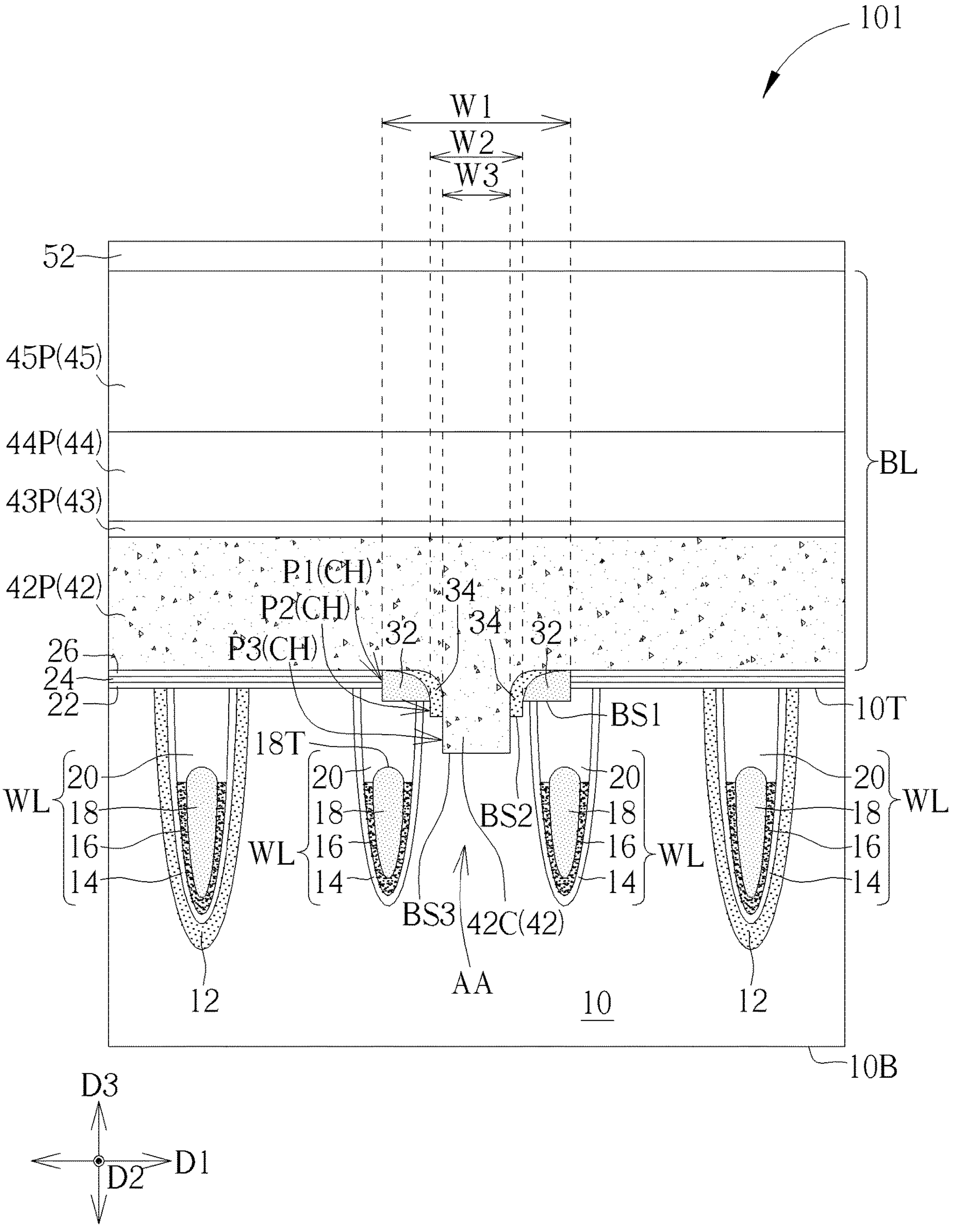
Figure 11:
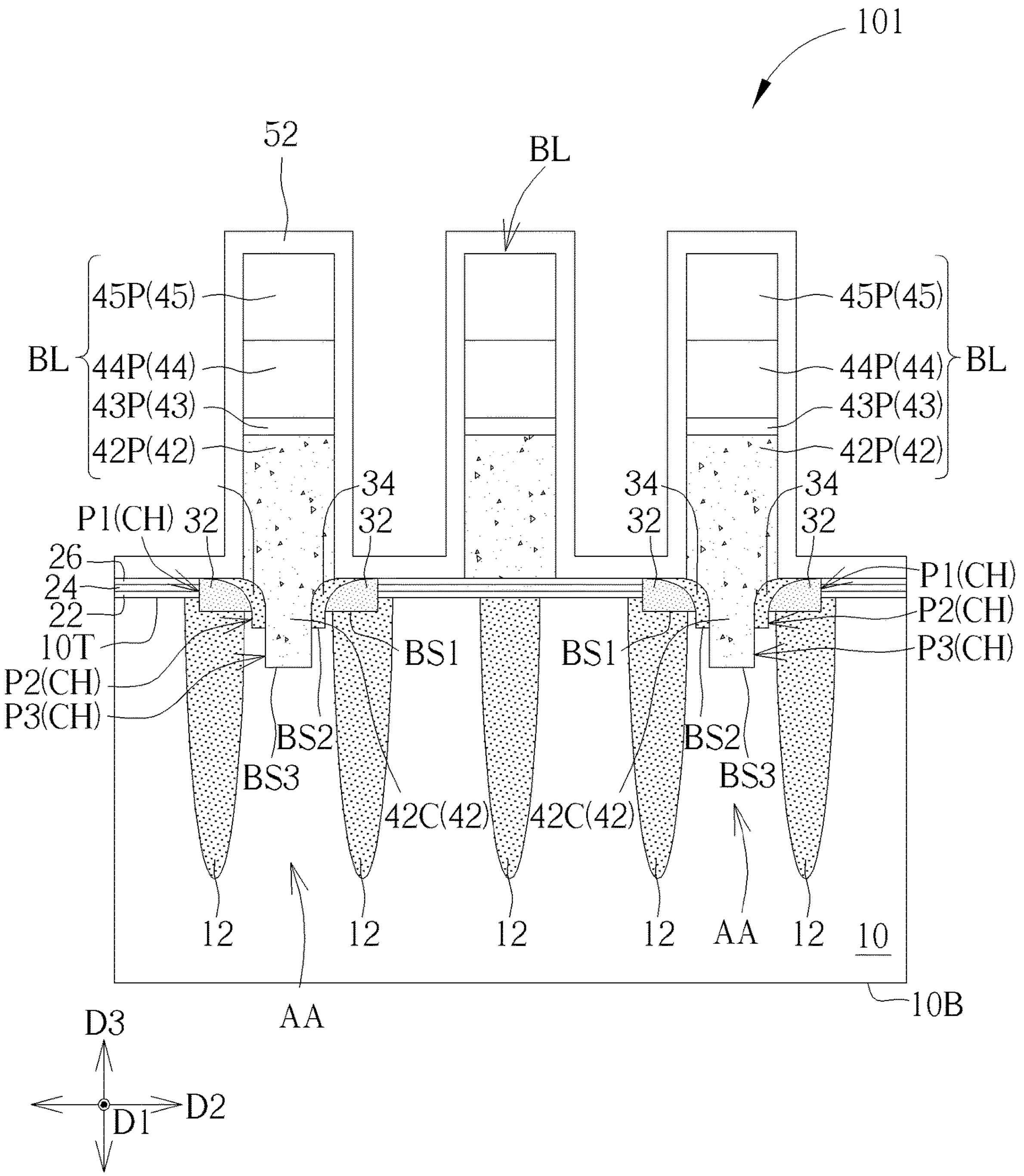

Please refer to FIG. 10 and FIG. 11. FIG. 10 is a cross-sectional schematic drawing illustrating a memory device 101 according to a first embodiment of the present invention, and FIG. 11 is a cross-sectional schematic drawing illustrating the memory device 101 and taken in another direction. For example, FIG. 10 may be regarded as a cross-sectional schematic drawing illustrating the memory device 101 and taken along a cross-sectional plane parallel with a horizontal direction D1 and a vertical direction D3, and FIG. 11 may be regarded as a cross-sectional schematic drawing illustrating the memory device 101 and taken along a cross-sectional plane parallel with a horizontal direction D2 and the vertical direction D3, but not limited thereto. As shown in FIG. 10 and FIG. 11, the memory device 101 includes a substrate 10, a bit line contact opening CH, and a bit line contact structure 42C. The bit line contact opening CH is at least partially disposed in the substrate 10, and the bit line contact opening CH includes a first portion P1, a second portion P2, and a third portion P3. The second portion P2 is located under the first portion P1 and connected with the first portion P1, and the third portion P3 is located under the second portion P2 and connected with the second portion P2. The bit line contact structure 42C is disposed in the first portion P1, the second portion P2, and the third portion P3 of the bit line contact opening CH. A first spacer (such as a spacer 32) is disposed in the first portion P1 of the bit line contact opening CH and surrounds the bit line contact structure 42C. The bit line contact opening CH including different portions and the spacer disposed in the bit line contact opening may be used to improve the influence of alignment shifts in the process of forming a bit line structure and the bit line contact structure on the production yield.

Specifically, in some embodiments, the substrate 10 may include a semiconductor substrate, such as a silicon substrate, an epitaxial silicon substrate, a silicon germanium substrate, a silicon carbide substrate, a silicon-on-insulator (SOI) substrate, or a substrate made of other suitable materials. In addition, the memory device 101 may further include an isolation structure 12 and word line structures WL disposed in the substrate 10. The isolation structure 12 may be used to define a plurality of active regions AA separated from one another in the substrate 10. For example, when the substrate 10 is a substrate containing silicon, each of the active regions AA may contain silicon. When silicon is the main component in the substrate 10, silicon may also be the main component in each of the active regions AA. The isolation structure 12 may include a single layer or multiple layers of insulation materials, such as silicon nitride, silicon oxynitride, silicon carbonitride, or other suitable insulation materials. In some embodiments, the isolation structure 12 may be regarded as shallow trench isolation (STI), but not limited thereto. In some embodiments, the word line structure WL may be partly formed in the isolation structure 12, and the word line structure WL may include a gate dielectric layer 14, a work function layer 16, an electrically conductive layer 18, and a capping layer 20, but not limited thereto. The gate dielectric layer 14 may include high dielectric constant (high-k) dielectric materials or other suitable dielectric materials. The high-k dielectric material described above may include hafnium oxide (HfOx), hafnium silicon oxide ($HfSiO_4$), hafnium silicon oxynitride (HfSiON), aluminum oxide ($Al_2O_3$), tantalum oxide ($Ta_2O_5$), zirconium oxide ($ZrO_2$), or other suitable high-k dielectric materials. The work function layer 16 may include titanium nitride, titanium carbide, tantalum nitride, tantalum carbide, tungsten carbide, titanium trialuminide, aluminum titanium nitride, or other suitable electrically conductive work function materials. The electrically conductive layer 18 may include tungsten, aluminum, copper, titanium aluminide, titanium, or other suitable electrically conductive materials with relatively low electrical resistivity. The capping layer 20 may include silicon nitride, silicon oxynitride, silicon carbonitride, or other suitable insulation materials.

In some embodiments, the vertical direction D3 described above may be regarded as a thickness direction of the substrate 10, the substrate 10 may have a top surface 10T and a bottom surface 10B opposite to the top surface 10T in the vertical direction D3, and the bit line contact opening CH and the bit line contact structure 42C may be disposed in a portion of the substrate 10 adjacent to the top surface 10T. Horizontal directions substantially orthogonal to the vertical direction D3 (such as the horizontal direction D1, the horizontal direction D2, and other directions orthogonal to the vertical direction D3) may be substantially parallel with the top surface 10T and/or the bottom surface 10B of the substrate 10, but not limited thereto. In this description, a distance between the bottom surface 10B of the substrate 10 and a relatively higher location and/or a relatively higher part in the vertical direction D3 may be greater than a distance between the bottom surface 10B of the substrate 10 and a relatively lower location and/or a relatively lower part in the vertical direction D3. The bottom or a lower portion of each component may be closer to the bottom surface 10B of the substrate 10 in the vertical direction D3 than the top or upper portion of this component. Another component disposed above a specific component may be regarded as being relatively far from the bottom surface 10B of the substrate 10 in the vertical direction D3, and another component disposed under a specific component may be regarded as being relatively close to the bottom surface 10B of the substrate 10 in the vertical direction D3. Additionally, in this description a top surface of a specific component may include the topmost surface of this component in the vertical direction D3, and a bottom surface of a specific component may include the bottommost surface of this component in the vertical direction D3, but not limited thereto. Additionally, in this description, the condition that a certain component is disposed between two other components in a specific direction may include a condition that the certain component is sandwiched between the two other components in the specific direction, but not limited thereto.

As shown in FIG. 10 and FIG. 11, in some embodiments, the memory device 101 may further include a bit line structure BL disposed on the substrate 10, and the bit line structure BL may be electrically connected with the active region AA via the bit line contact structure 42C, such as being electrically connected with a doped region in the active region AA (such as a source/drain doped region, not illustrated), but not limited thereto. In some embodiments, the bit line structure BL may include a patterned electrically conductive layer 42P, a patterned barrier layer 43P, a patterned electrically conductive layer 44P, and a patterned mask layer 45P. The bit line contact structure 42C and the patterned electrically conductive layer 42P may include electrically conductive metallic materials or electrically conductive non-metallic materials, such as polycrystalline silicon, amorphous silicon, or other electrically conductive non-metallic materials containing silicon. The patterned barrier layer 43P may include titanium, titanium nitride, tungsten nitride, or other suitable electrically conductive barrier materials. The patterned electrically conductive layer 44P may include aluminum, tungsten, copper, titanium aluminide, or other suitable electrically conductive metallic materials with low electrical resistivity. The patterned mask layer 45P may include silicon nitride, silicon oxide, or other suitable insulation materials. In some embodiments, the bit line contact structure 42C and the patterned electrically conductive layer 42P may include the same material composition and may be directly connected with each other, but not limited thereto. In addition, the memory device 101 may further include a spacer 52 disposed on the bit line structure BL and a mask layer disposed between the bit line structure BL and the substrate 10. The spacer 52 may include a single layer or stacked multiple layers of insulation materials, such as an oxide insulation material, a nitride insulation material, an oxynitride insulation material, or other suitable insulation materials. The mask layer may include multiple layers of mask materials. For example, a mask layer 22, a mask layer 24, and a mask layer 26 may be disposed and stacked between the bit line structure BL and the substrate 10 in the vertical direction D3, and the mask layer 22, the mask layer 24, and the mask layer 26 may include silicon nitride, silicon oxynitride, silicon carbonitride, or other suitable insulation materials.

In some embodiments, the first portion P1 of the bit line contact opening CH may penetrate through the mask layer 26, the mask layer 24, and the mask layer 22 in the vertical direction D3 to be partly located in the capping layer 20 of the word line structure WL, and a bottom surface BS1 of the first portion P1 of the bit line contact opening CH may be lower than a top surface of the word line structure WL in the vertical direction D3 accordingly. Additionally, in some embodiments, a bottom surface BS2 of the second portion P2 of the bit line contact opening CH is lower than the bottom surface BS1 of the first portion P1 in the vertical direction D3, a bottom surface BS3 of the third portion P3 is lower than the bottom surface BS2 of the second portion P2 in the vertical direction D3, a width of the second portion P2 (such as a width W2) may be less than a width of the first portion P1 (such as a width W1), and a width of the third portion P3 (such as a width W3) may be less than the width of the first portion P1 and/or the width of the second portion P2. The width described above may be regarded as a length in a horizontal direction (such as the horizontal direction D1, the horizontal direction D2, and other horizontal directions orthogonal to the vertical direction D3), and the first portion P1, the second portion P2, and the third portion D3 may be regarded as three portions gradually shrinking from top to bottom in the vertical direction D3. Therefore, the first portion P1, the second portion P2, and the third portion P3 of the bit line contact opening CH may include a ladder-shaped structure at an inner wall of the bit line contact opening CH, but not limited thereto. In some embodiments, the length of the second portion P2 of the bit line contact opening CH in the horizontal direction D1 and the length of the third portion P3 of the bit line contact opening CH in the horizontal direction D1 may be less than the distance between two of the word line structures WL adjacent to each of the in the horizontal direction D1, and a part of the substrate 10 may be sandwiched between the bit line contact structure 42C and the word line structure WL in the horizontal direction D1 accordingly. In other words, a part of the substrate 10 may be sandwiched between the second portion P2 of the bit line contact opening CH and the word line structure WL in the horizontal direction D1, and another portion of the substrate 10 may be sandwiched between the third portion P3 of the bit line contact opening CH and the word line structure WL in the horizontal direction D1. In addition, a bottom surface of the bit line contact structure 42C (such as the bottom surface BS3 of the third portion P3 of the bit line contact opening CH) may be higher than a top surface 18T of the electrically conductive layer 18 of the word line structure WL in the vertical direction D3, but not limited thereto. In some embodiments, the bottom surface of the bit line contact structure 42C may be lower than the top surface 18T of the electrically conductive layer 18 of the word line structure WL in the vertical direction D3 according to some design considerations.

In some embodiments, the memory device 101 may further include a second spacer (such as a spacer 34) disposed in the bit line contact opening CH and surrounding the bit line contact structure 42C. The spacer 34 may be partly disposed on the spacer 32, at least a part of the spacer 34 may be disposed in the second portion P2 of the bit line contact opening CH, and a bottom surface of the spacer 34 (such as the bottom surface BS2) may be higher than the bottom surface BS3 of the third portion P3 of the bit line contact opening CH in the vertical direction D3. In some embodiments, the spacer 32 may be disposed in the first portion P1 of the bit line contact opening CH and is not disposed in the second portion P2 and the third portion P3 of the bit line contact opening CH. The spacer 34 may be partly disposed in the first portion P1 of the bit line contact opening CH (such as being disposed on the spacer 32) and partly disposed in the second portion P2 of the bit line contact opening CH, and the spacer 34 is not disposed in the third portion P3 of the bit line contact opening CH, but not limited thereto. The spacer 32 and the spacer 34 may respectively include a single layer or multiple layers of insulation materials, such as an oxide insulation material, a nitride insulation material, an oxynitride insulation material, or other suitable insulation materials, and the material composition of the spacer 34 may be identical to or different from the material composition of the spacer 32 according to some design considerations.

Figure 1:
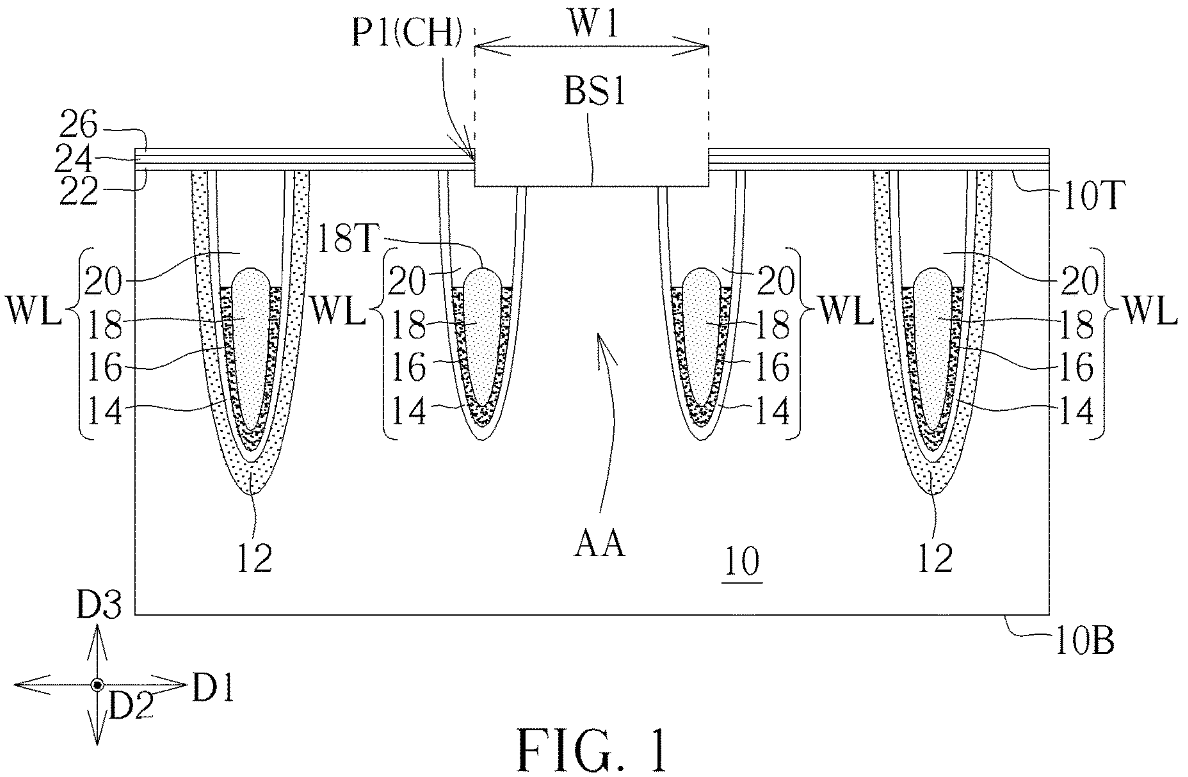
Figure 2:
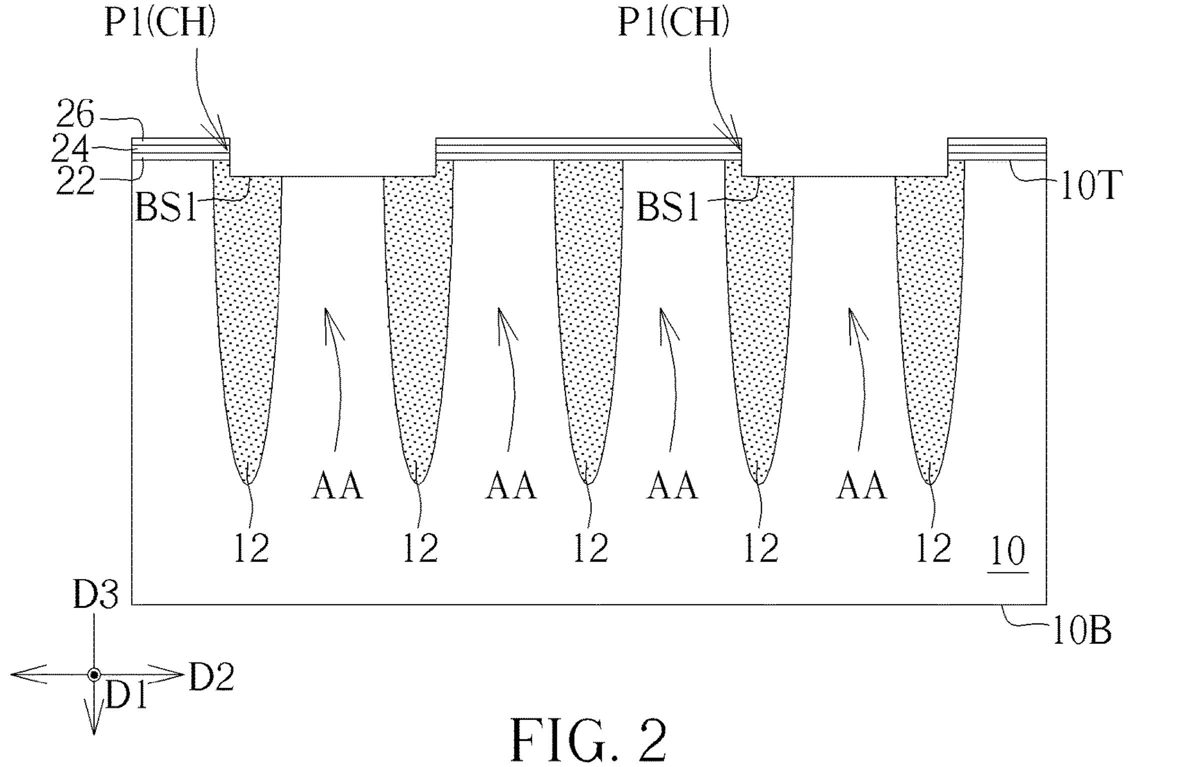
Figure 3:
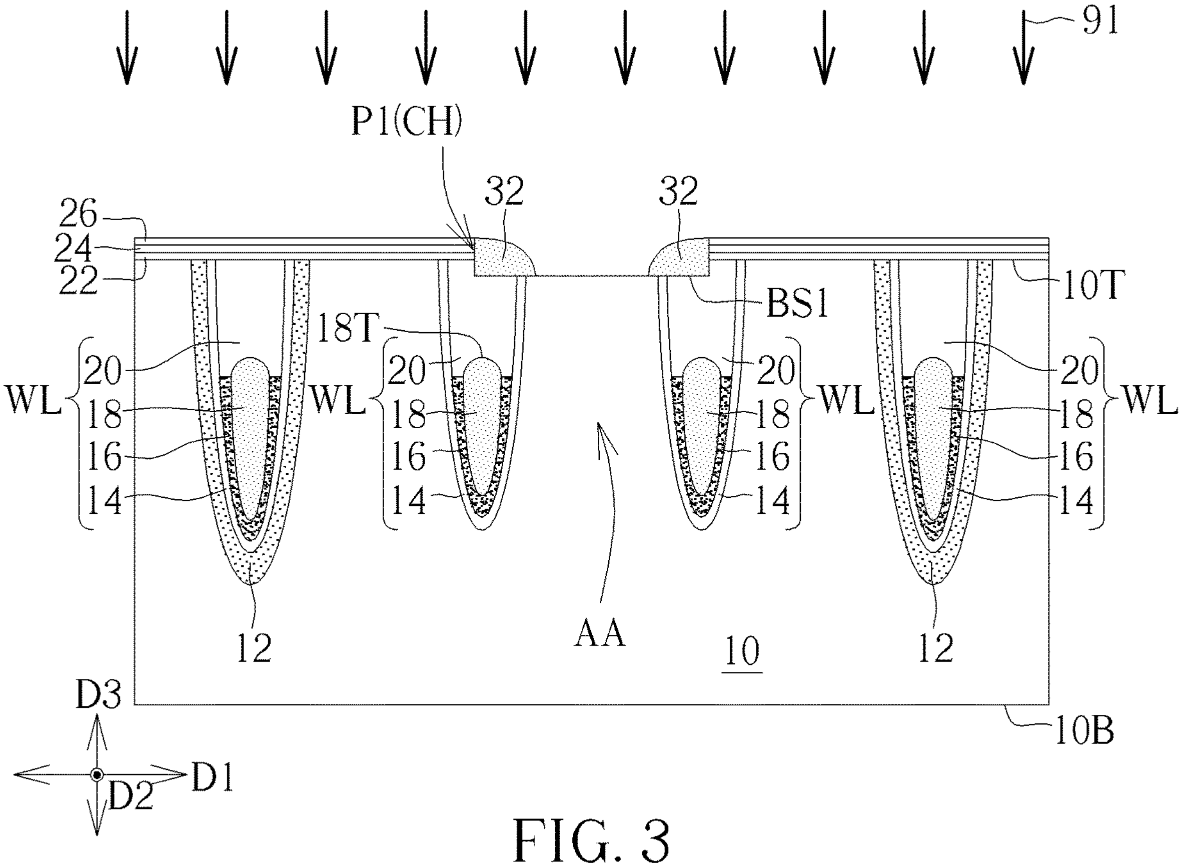
Figure 4:
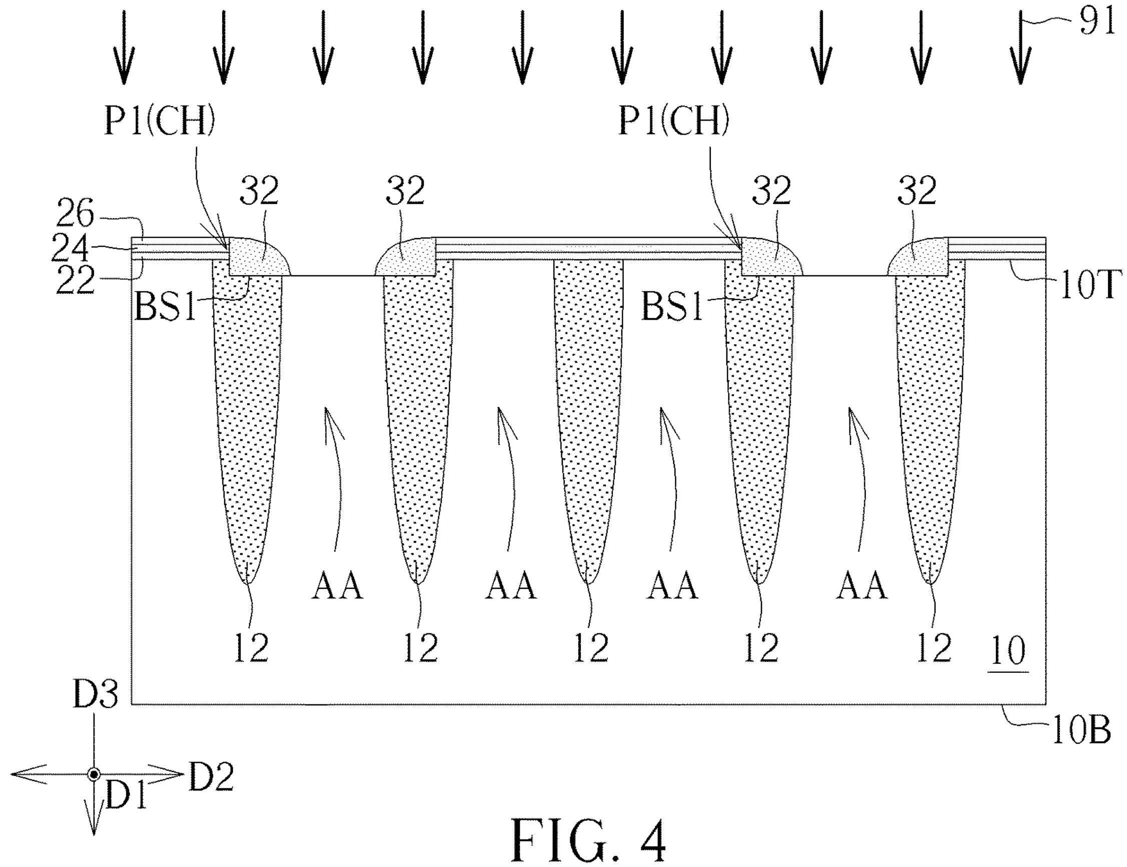
Figure 5:
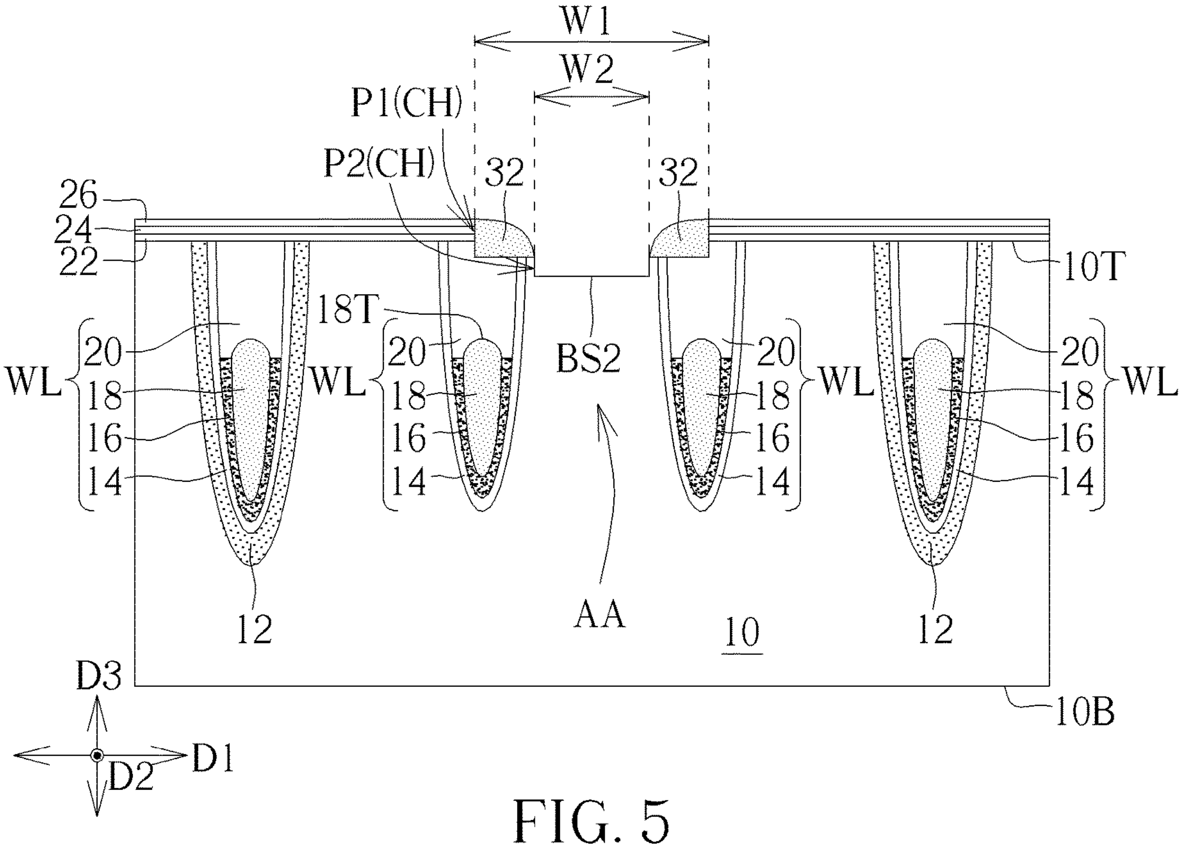
Figure 6:
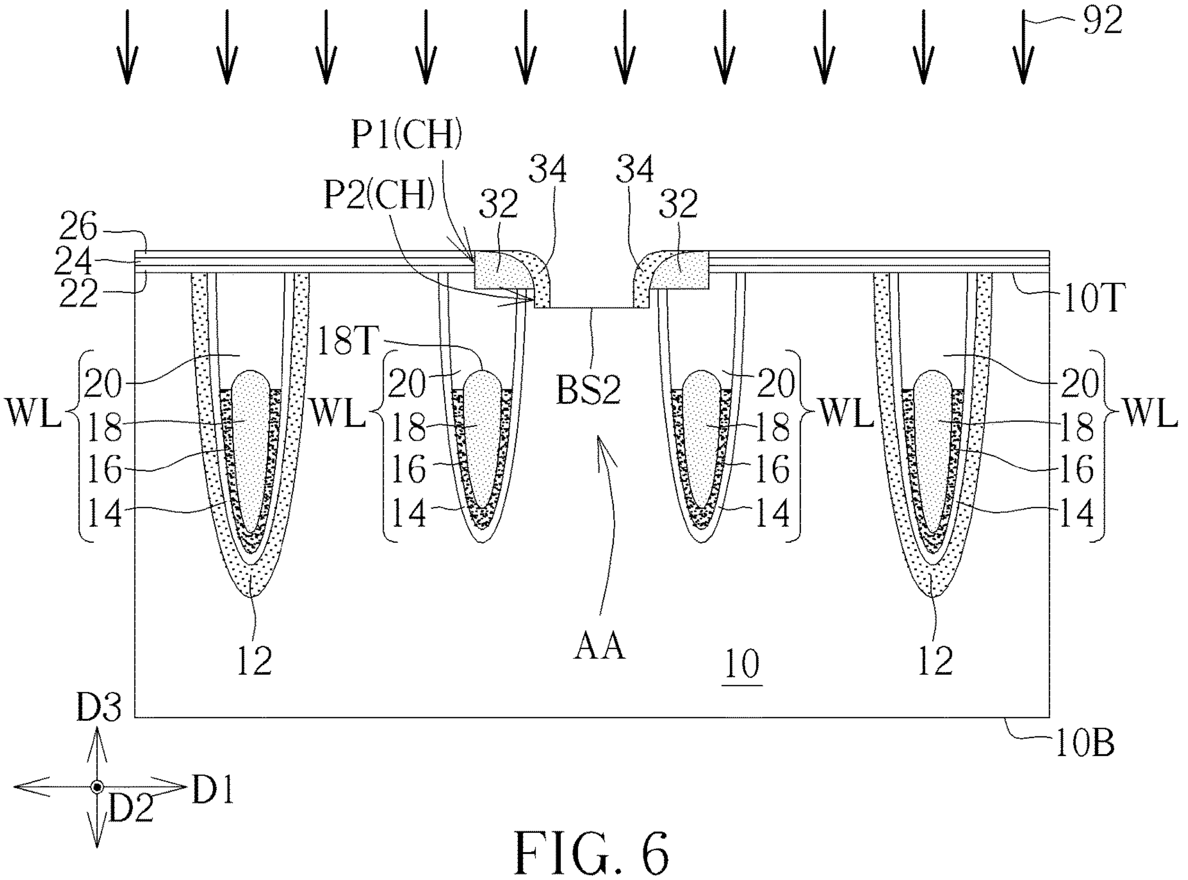
Figure 7:
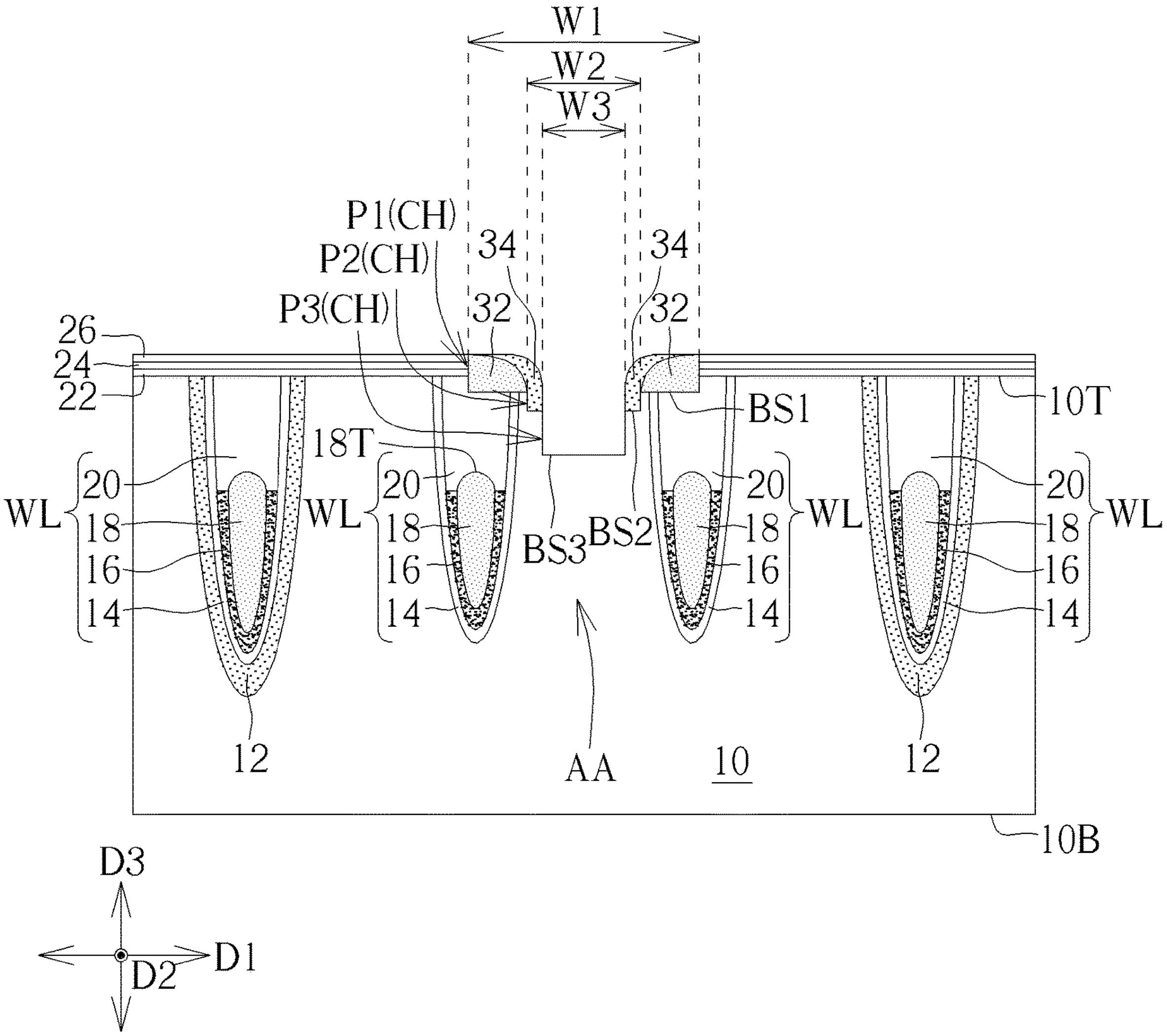
Figure 8:
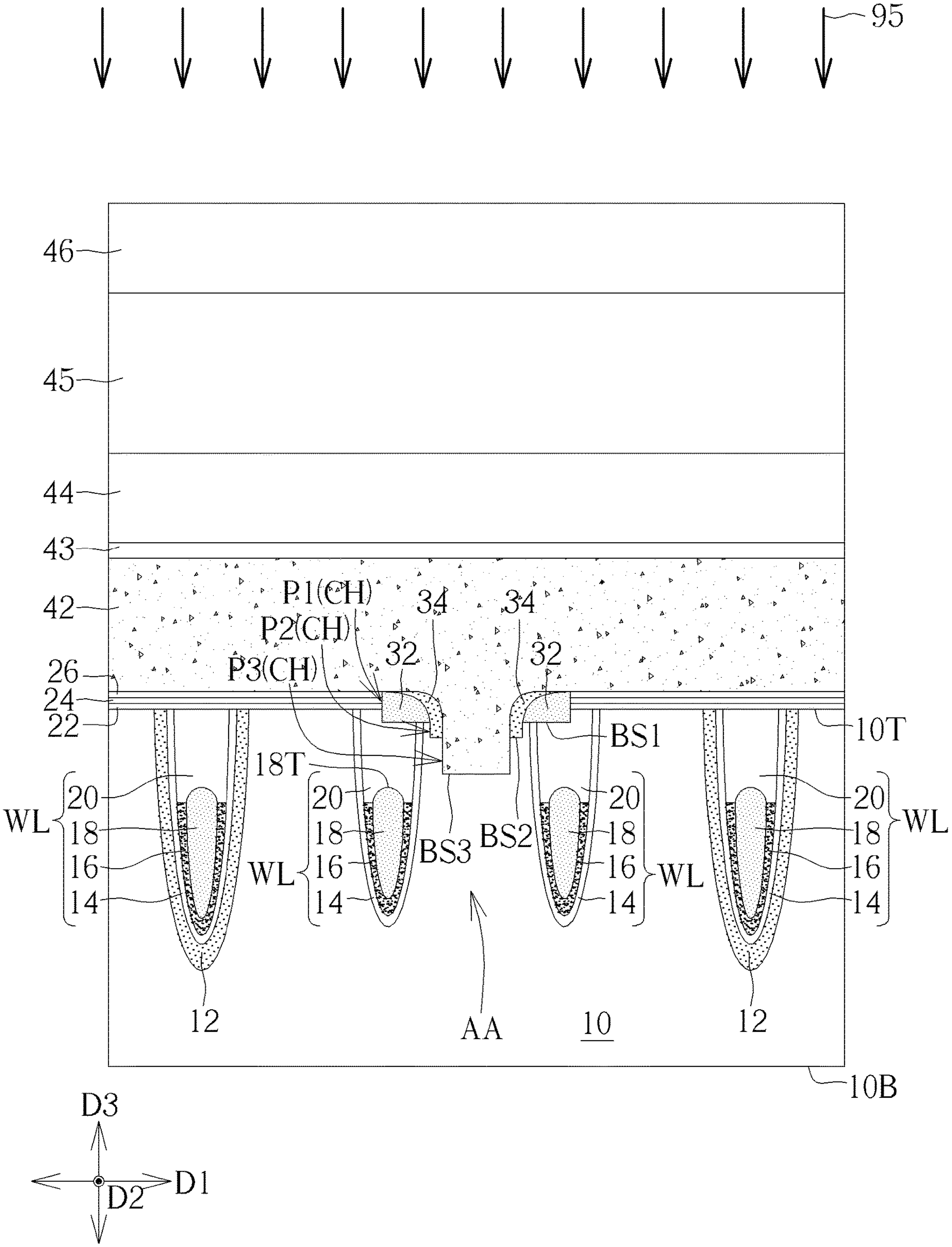
Figure 9:
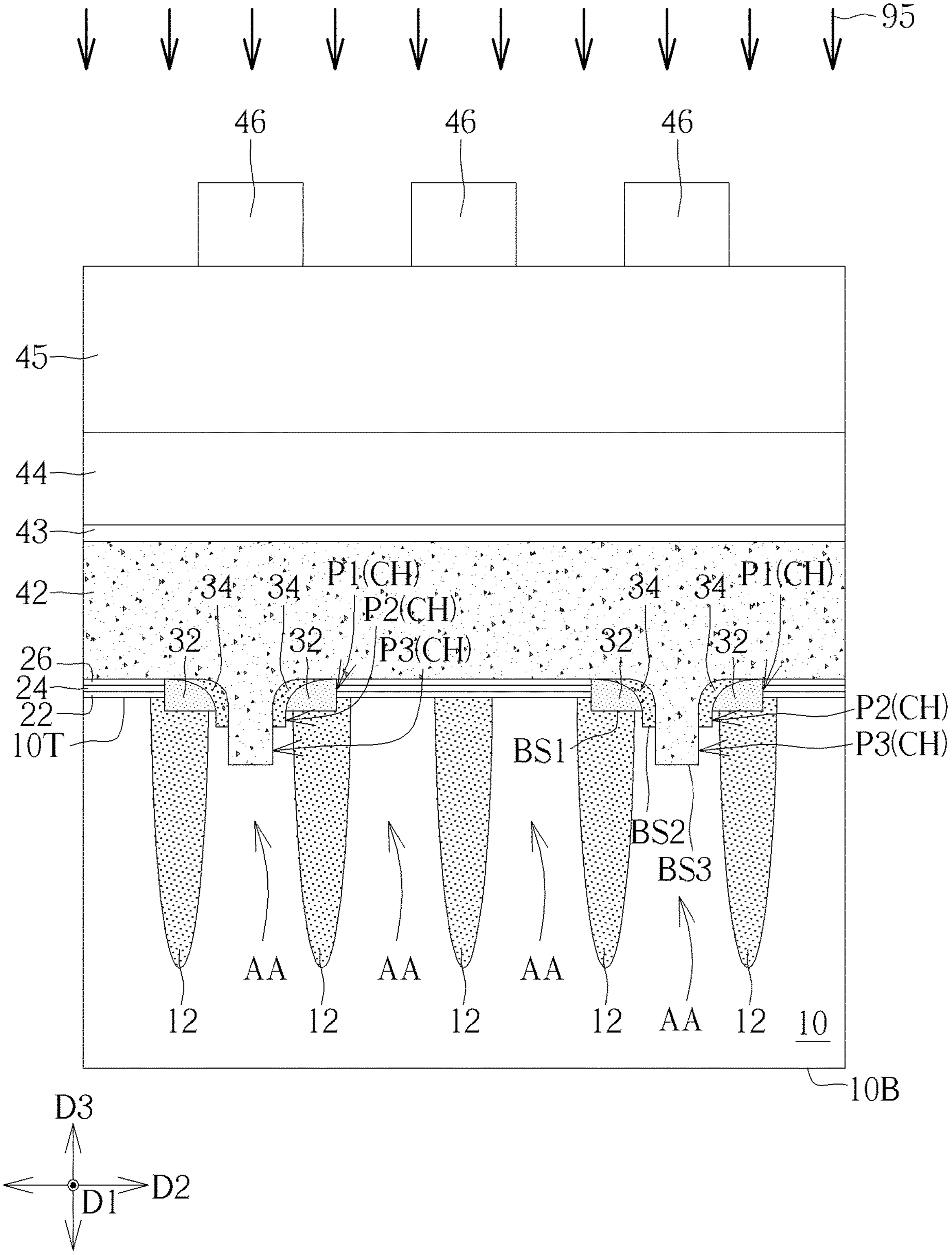

Please refer to FIGS. 1-11. FIGS. 1-11 are schematic drawings illustrating a manufacturing method of a memory device according to a first embodiment of the present invention, wherein FIG. 1 and FIG. 2 are cross-sectional schematic drawings taken in different directions, FIG. 3 is a schematic drawing in a step subsequent to FIG. 1, FIG. 4 is a schematic drawing in a step subsequent to FIG. 2, FIG. 5 is a schematic drawing in a step subsequent to FIG. 3, FIG. 6 is a schematic drawing in a step subsequent to FIG. 5, FIG. 7 is a schematic drawing in a step subsequent to FIG. 6, FIG. 8 is a schematic drawing in a step subsequent to FIG. 7, FIG. 9 is a cross-sectional schematic drawing taken in another direction under the situation of FIG. 8, FIG. 10 is a schematic drawing in a step subsequent to FIG. 8, and FIG. 11 is a schematic drawing in a step subsequent to FIG. 9. As shown in FIG. 10 and FIG. 11, the manufacturing method in this embodiment may include the following steps. The substrate 10 is provided, and the first portion P1 of the bit line contact opening CH is formed in the substrate 10. The first spacer (such as the spacer 32) is formed in the first portion P1 of the bit line contact opening CH. The second portion P2 of the bit line contact opening CH is formed after the spacer 32 is formed. The second portion P2 is located under and connected with the first portion P1. The third portion P3 of the bit line contact opening CH is formed after the second portion P2 of the bit line contact opening CH is formed. The third portion P3 is located under and connected with the second portion P2. The bit line contact structure 42C is formed in the bit line contact opening CH. The bit line contact structure 42C is formed in the first portion P1, the second portion P2, and the third portion P3 of the bit line contact opening CH, and the spacer 32 surrounds the bit line contact structure 42C.

Specifically, the manufacturing method in this embodiment may include but is not limited to the following steps. As shown in FIG. 1 and FIG. 2, before the step of forming the first portion P1 of the bit line contact opening CH, the isolation structure 12 and the word line structure WL described above may be formed in the substrate 10, and the mask layer 22, the mask layer 24, and the mask layer 26 may be formed on the substrate 10. Subsequently, a removing process (such as a photolithography process, but not limited thereto) may be used to remove a part of the mask layer 26, a part of the mask layer 24, a part of the mask layer 22, a part of the isolation structure 12, a part of the word line structure WL (such as a part of the capping layer 20 and a part of the gate dielectric layer 14), and a part of the substrate for forming the first portion P1 of the bit line contact opening CH. The first portion P1 of the bit line contact opening CH may partly overlap the word line structure WL in the vertical direction D3, the bottom surface BS1 of the first portion P1 may be lower than the top surface 10T of the substrate 10 and higher than the top surface 18T of the electrically conductive layer 18 in the vertical direction D3, and the width W1 of the first portion P1 may be greater than the distance between two of the word line structures WL adjacent to each other in the horizontal direction D1. Subsequently, as shown in FIG. 3 and FIG. 4, the spacer 32 may be formed in the first portion P1 of the bit line contact opening CH, the spacer 32 may be formed on the inner sidewall of the first portion P1, and the spacer 32 may be regarded as being formed on sidewalls of the mask layer 22, the mask layer 24, and the mask layer 26. In some embodiments, the spacer 32 may be formed by forming a spacer material layer conformally on the mask layer 26 and conformally in the first portion P1 and performing an etching back process to this spacer material layer for removing the spacer material layer formed on the mask layer 26 and removing a part of the spacer material layer formed in the first portion P1, but not limited thereto. The spacer 32 may also be formed by other suitable approaches according to some design considerations in the present invention.

As shown in FIG. 3 and FIG. 5, after the step of forming the spacer 32, a first removing process 91 using the spacer 32 as a mask may be performed to at least a part of the substrate 10 for removing a part of the substrate 10 and forming the second portion P2 of the bit line contact opening CH in the substrate 10. Because of the influence of the spacer 32, the width W2 of the second portion P2 may be less than the width W1 of the first portion P1. In some embodiments, the first removing process 91 may include an etching process or other suitable removing approaches, the spacer 32 and the mask layer 26 may be regarded as an etching mask in this etching process, and the second portion P2 of the bit line contact opening CH may be formed self-aligned accordingly, but not limited thereto. As shown in FIG. 5 and FIG. 6, after the second portion P2 of the bit line contact opening CH is formed, the second spacer (such as the spacer 34) may be formed, and the spacer 34 may be partly formed in the first portion P1 of the bit line contact opening CH (such as being formed of the space 32) and partly formed in the second portion P2 of the bit line contact opening CH. In some embodiments, the spacer 34 may be formed by forming a spacer material layer conformally on the mask layer 26 and the spacer 32 and conformally in the first portion P1 and the second portion P2 of the bit line contact opening CH and performing an etching back process to this spacer material layer for removing the spacer material layer formed on the mask layer 26 and removing a part of the spacer material layer formed in the first portion P1 and/or the second portion P2, but not limited thereto. The spacer 34 may also be formed by other suitable approaches according to some design considerations in the present invention.

As shown in FIG. 6 and FIG. 7, after the spacer 34 is formed, a second removing process 92 using the spacer 34 as a mask may be performed to at least a part of the substrate 10 for removing a part of the substrate 10 and forming the third portion P3 of the bit line contact opening CH in the substrate 10. Because of the influence of the spacer 34, the width W3 of the third portion P3 may be less than the width W2 of the second portion P2. In some embodiments, the second removing process 92 may include an etching process or other suitable removing approaches, the spacer 34, the spacer 32, and/or the mask layer 26 may be regarded as an etching mask in this etching process, and the third portion P3 of the bit line contact opening CH may be formed self-aligned accordingly, but not limited thereto. It is worth noting that, the method of forming the second portion P2 and the third portion P3 of the bit line contact opening CH may include but is not limited to the steps illustrated in FIGS. 3-7 described above, and the second portion P2 and the third portion P3 of the bit line contact opening CH in the present invention may also be formed by other suitable approaches according to some design considerations. As shown in FIG. 8 and FIG. 9, after the step of forming the third portion P3 of the bit line contact opening CH, an electrically conductive material 42, a barrier material 43, an electrically conductive material 44, a mask material 45, and a patterned mask layer 46 may be formed sequentially, and the first portion P1, the second portion P2, and the third portion P3 of the bit line contact opening CH may be filled with the electrically conductive material 42. Subsequently, as shown in FIGS. 8-11, a patterning process 95 using the patterned mask layer 46 as a mask may be performed for forming the bit line structure BL and the bit line contact structure 42C described above. In other words, the bit line structure BL and the bit line contact structure 42C are formed after the second removing process 92 illustrated in FIG. 9 described above, the electrically conductive material 42 in the bit line contact opening CH may become the bit line contact structure 42C after the patterning process 95, the electrically conductive material 42 located outside the bit line contact opening CH may be patterned by the patterning process 95 to become the patterned electrically conductive layer 42P, the barrier material 43 may be patterned by the patterning process 95 to become the patterned barrier layer 43P, the electrically conductive material 44 may be patterned by the patterning process 95 to become the patterned electrically conductive layer 44P, and the mask material 45 may be patterned by the patterning process 95 to become the patterned mask layer 45P. After the patterning process 95, the spacer 52 may be formed on the bit line structure BL.

The second portion P2 and the third portion P3 of the bit line contact opening CH may be located far from the word line structures WL by the manufacturing method described above, the bit line contact structure 42C may be kept from being connected with the word line structure WL when alignment shift occurs in the step of forming the bit line structure BL and the bit line contact structure 42C (such as a condition where a position of the patterned mask layer 46 described above shifts) or process variations occur in the step of forming the bit line structure BL and the bit line contact structure 42C (such as over etching in the patterning process 95 described above), and the production yield may be improved accordingly. In addition, the second portion P2 and the third portion P3 of the bit line contact opening CH may be formed self-aligned, and the second portion P2 and the third portion P3 with relatively small dimension may be formed without being limited by the resolution of the photolithography process accordingly.

The following description will detail the different embodiments of the present invention. To simplify the description, the following description will detail the dissimilarities among different embodiments and the identical features will not be redundantly described. In addition, identical components in each of the following embodiments of the present invention are marked with identical symbols for making it easier for comparing the embodiments more conveniently.

Figure 12:
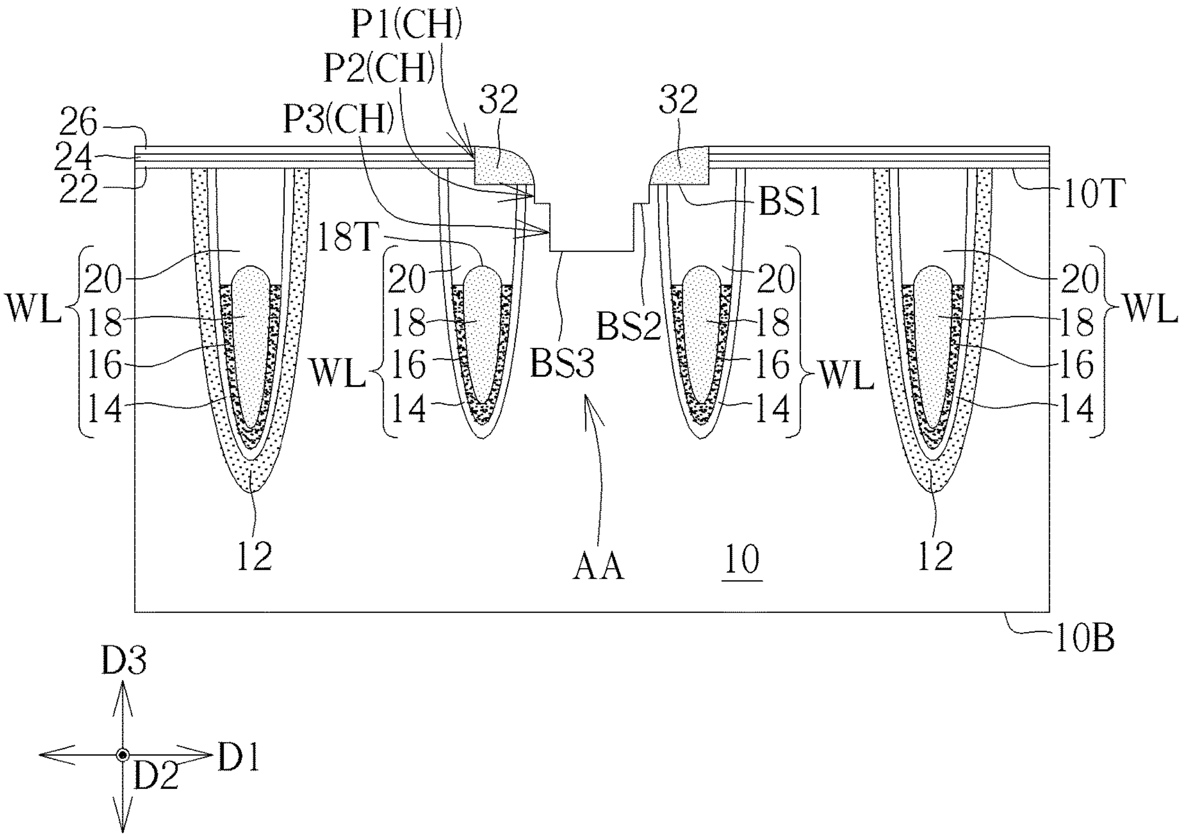
Figure 13:
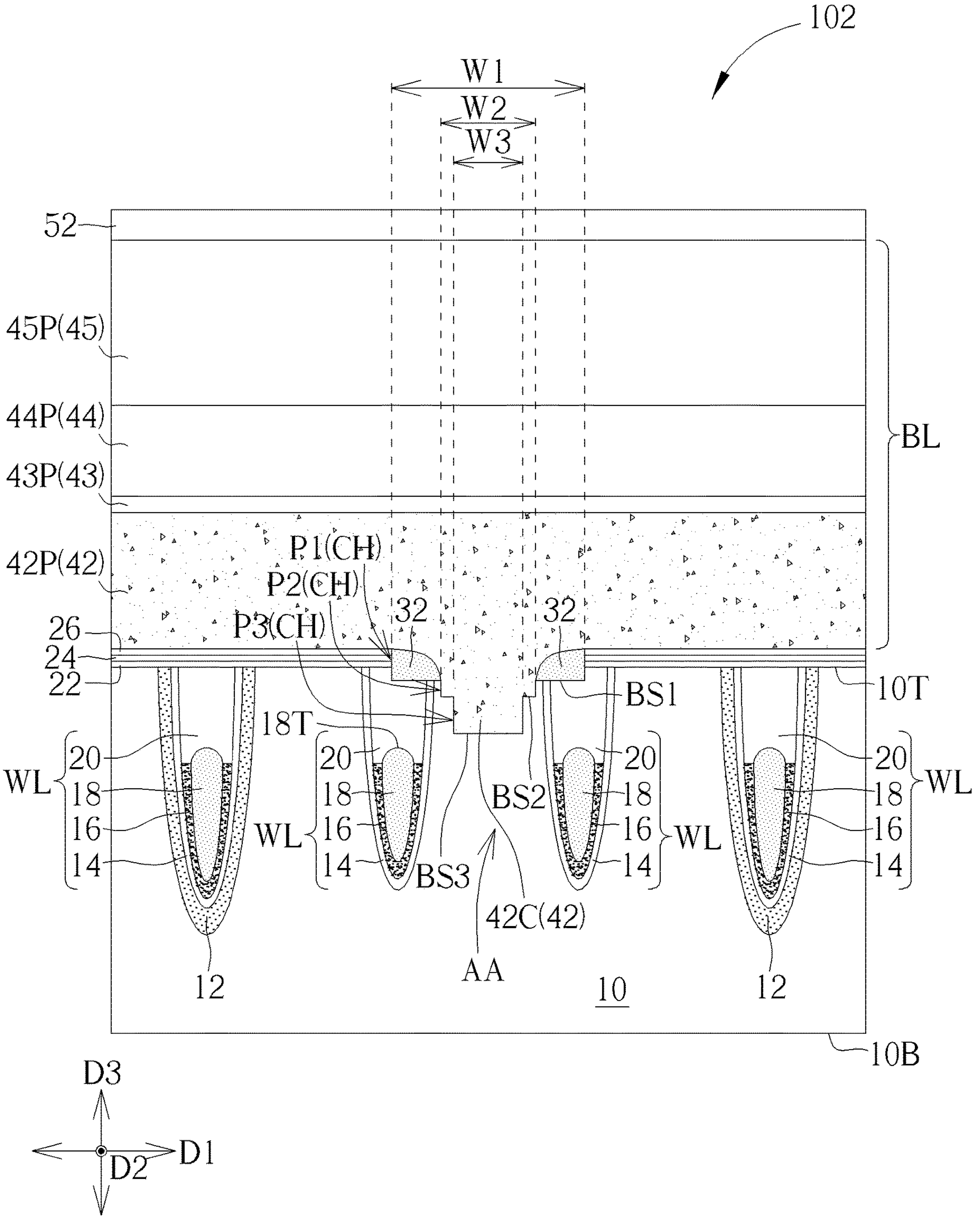
Figure 14:
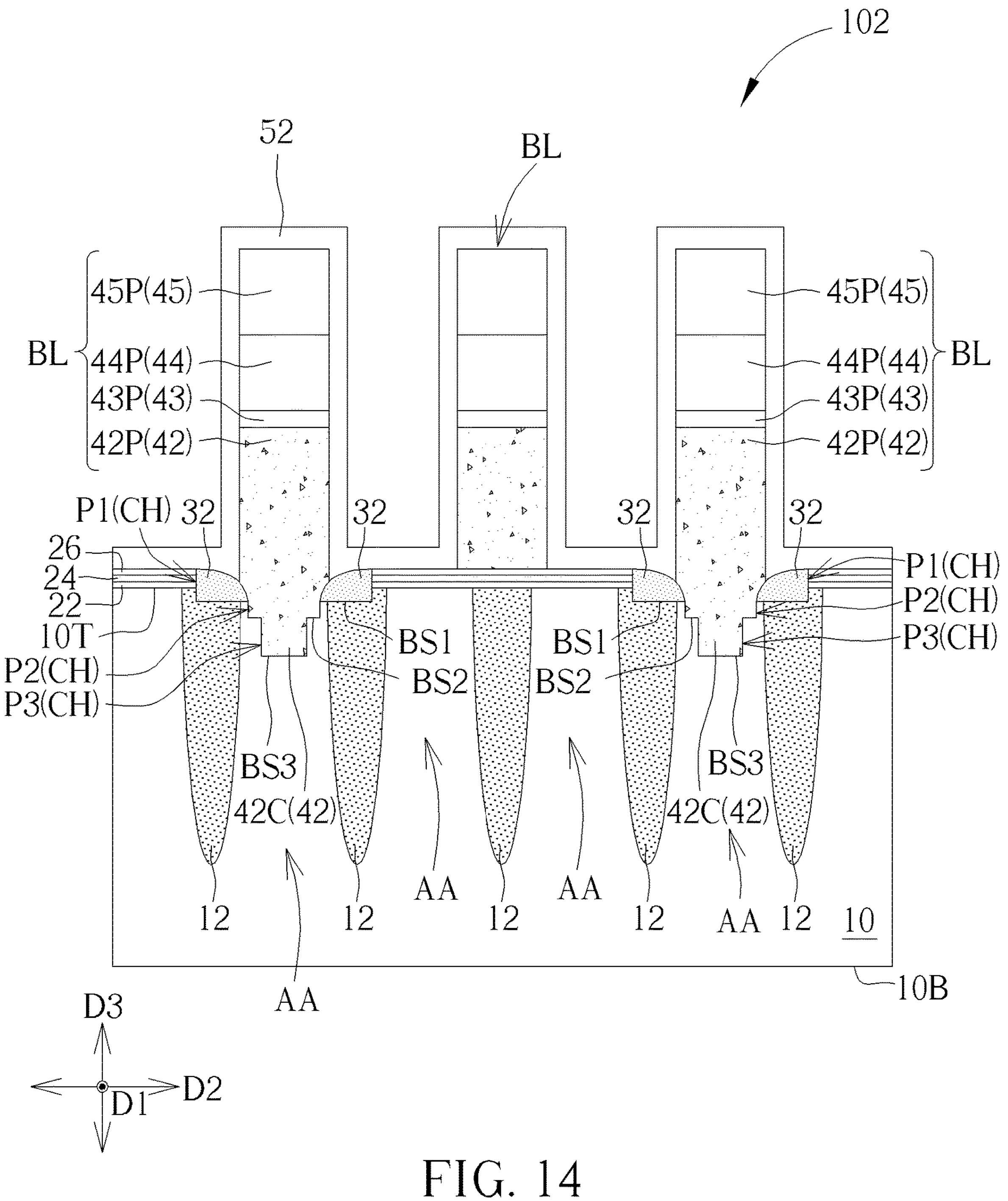

Please refer to FIGS. 12-14, and FIG. 7. FIGS. 12-14 are schematic drawings illustrating a manufacturing method of a memory device 102 according to a second embodiment of the present invention, wherein FIG. 13 is a schematic drawing in a step subsequent to FIG. 12, and FIG. 14 is a cross-sectional schematic drawing taken in another direction under the situation of FIG. 13. In some embodiments, FIG. 12 may be regarded as a schematic drawing in a step subsequent to FIG. 7, but not limited thereto. As shown in FIG. 7 and FIG. 12, in the manufacturing method in this embodiment, after the third portion P3 of the bit line contact opening CH is formed, the spacer 34 may be removed for exposing the bottom surface BS2 of the second portion P2 and the bottom surface BS3 of the third portion P3. Subsequently, as shown in FIGS. 12-14, the bit line contact structure 42C may be formed in the bit line contact opening CH, and the bit line structure BL and the spacer 52 described above may be formed. In other words, the spacer 34 may be removed before the bit line contact structure BL is formed. In the memory device 102, the bit line contact structure 42C may contact the bottom surface BS2 of the second portion P2 and the bottom surface BS3 of the third portion P3, and the bit line contact structure 42C may include a ladder-shaped structure accordingly, such as a ladder-shaped structure at the sidewall of the lower portion of the bit line contact structure 42C.

Figure 15:
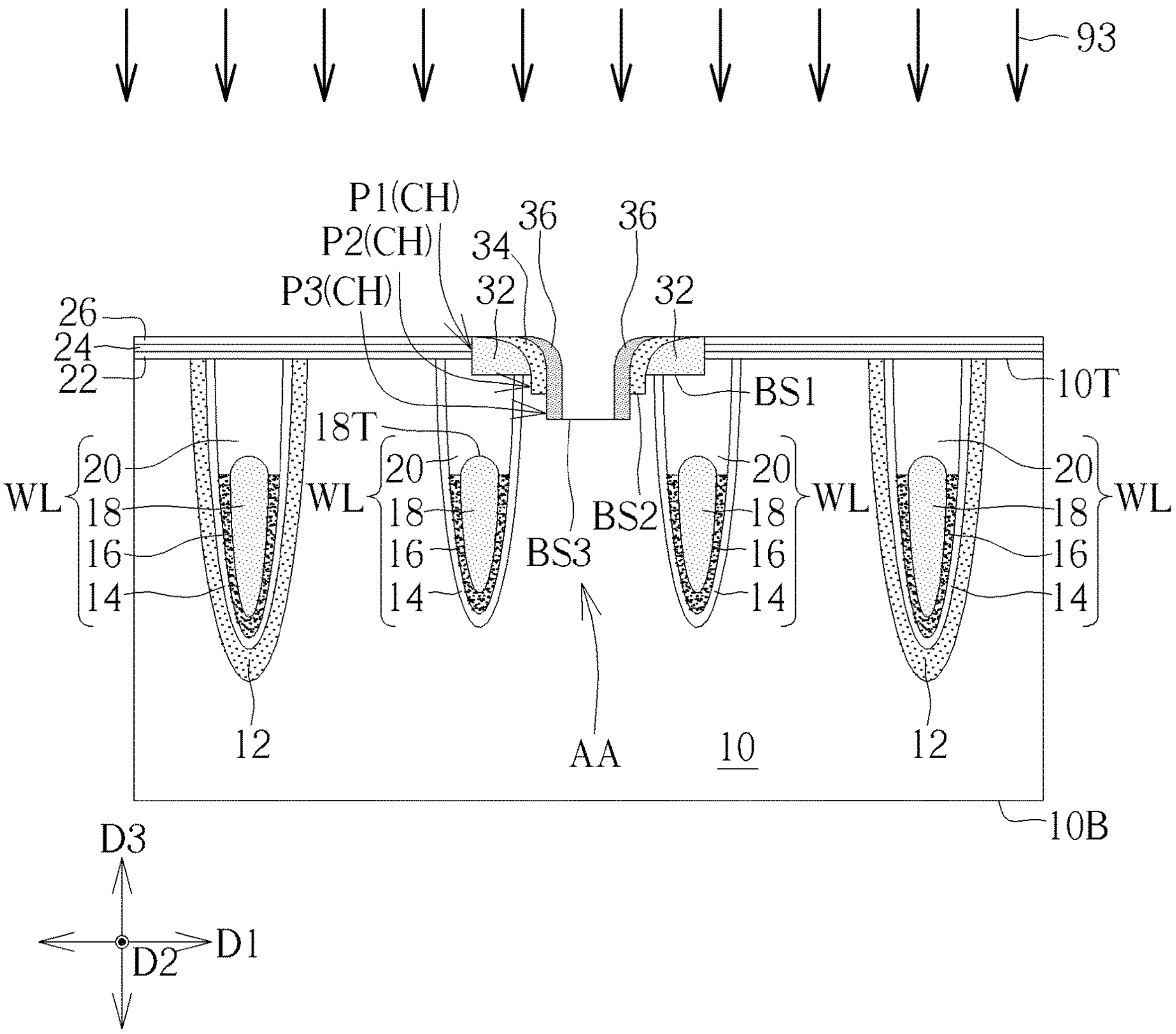
Figure 16:
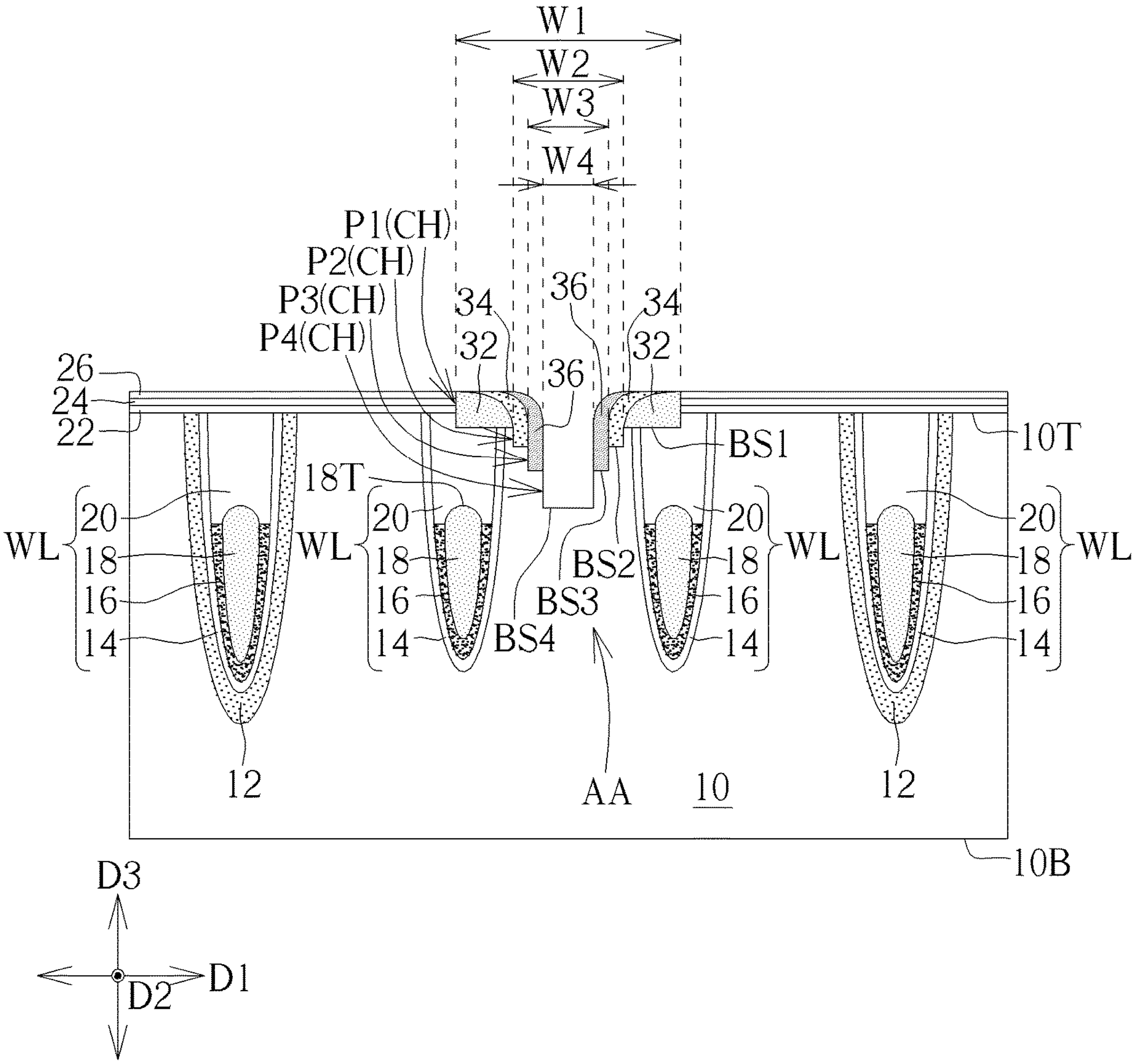
Figure 17:
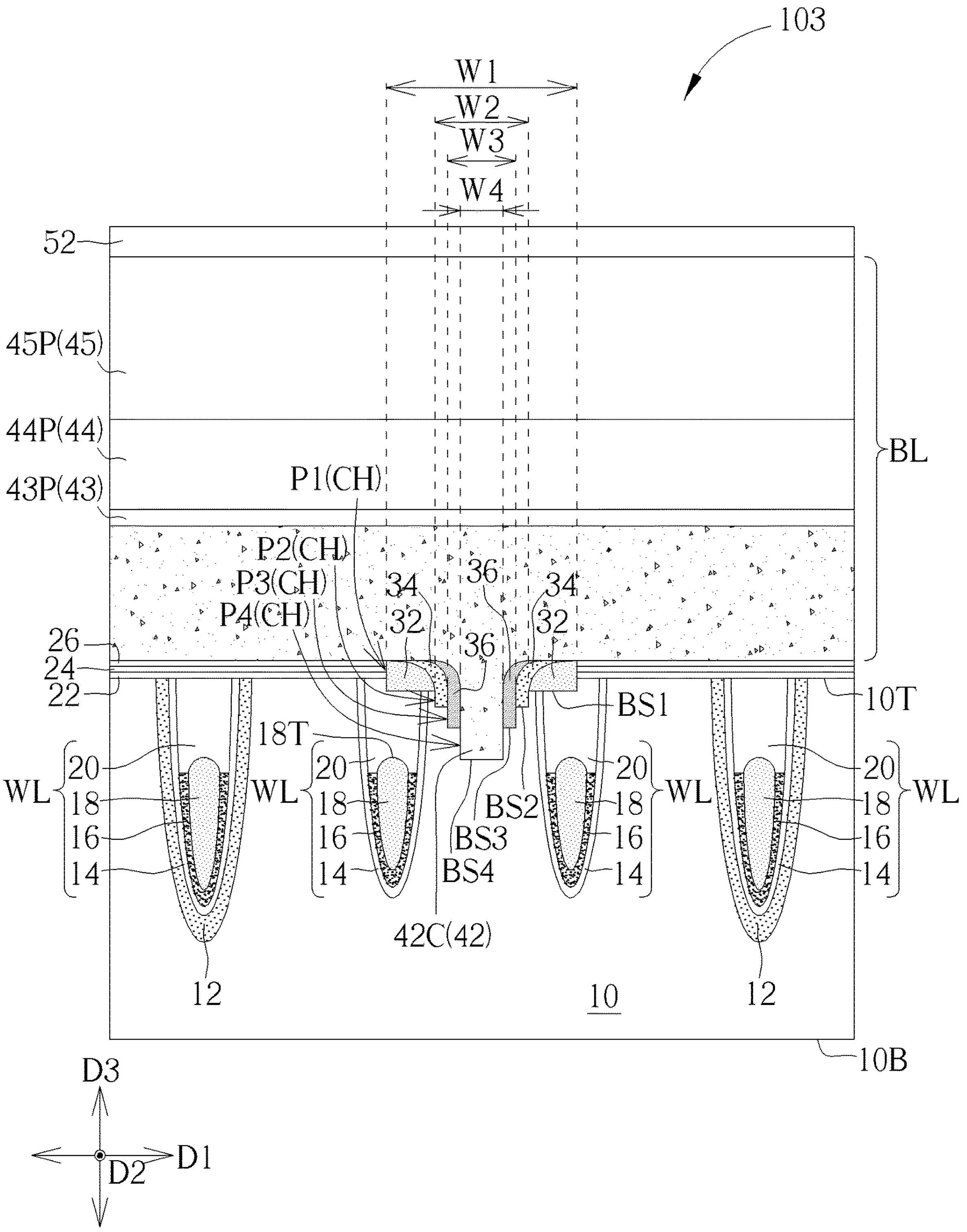
Figure 18:
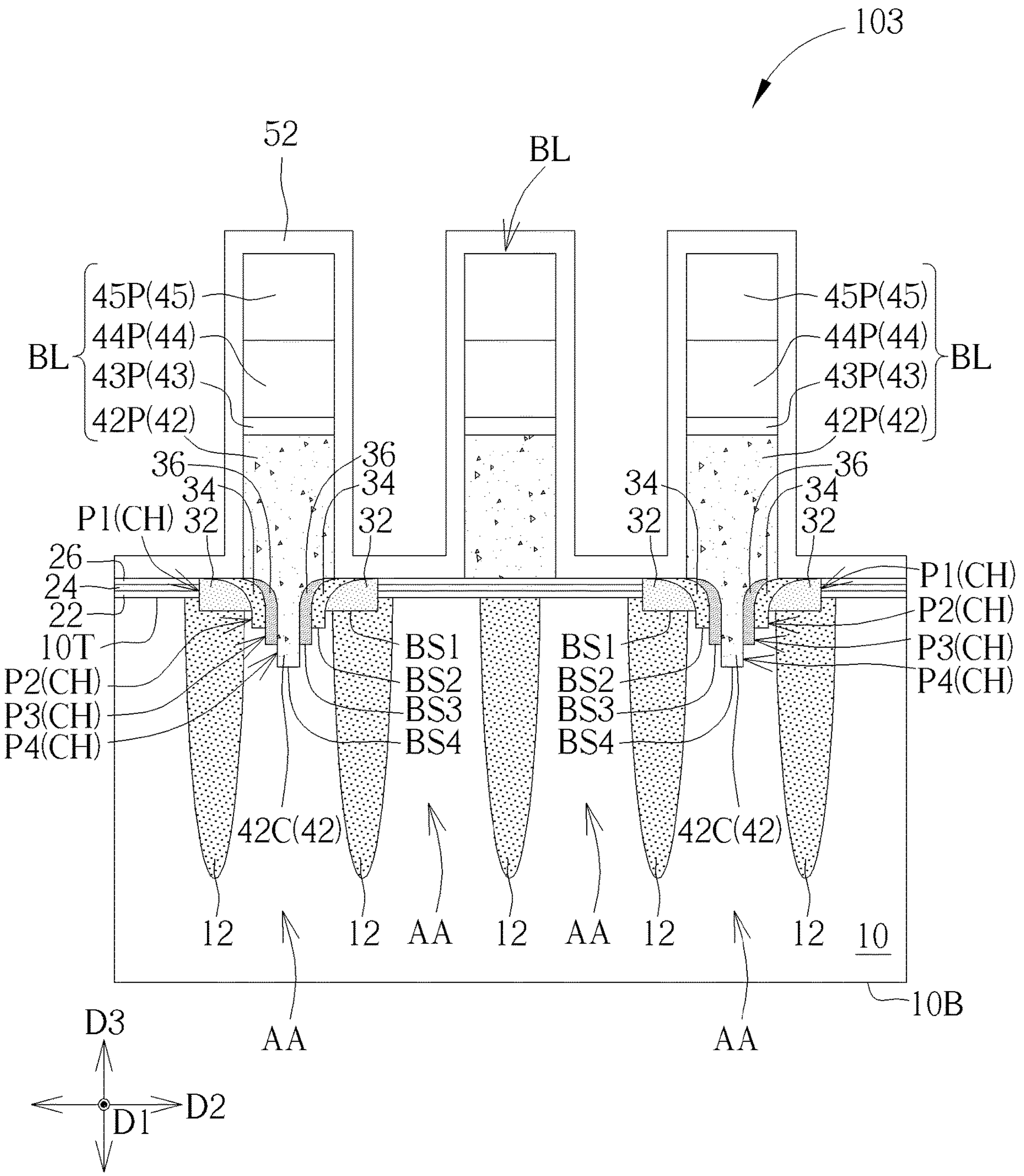

Please refer to FIGS. 15-18 and FIG. 7. FIGS. 15-18 are schematic drawings illustrating a manufacturing method of a memory device 103 according to a third embodiment of the present invention, wherein FIG. 16 is a schematic drawing in a step subsequent to FIG. 15, FIG. 17 is a schematic drawing in a step subsequent to FIG. 16, and FIG. 18 is a cross-sectional schematic drawing taken in another direction under the situation of FIG. 17. In some embodiments, FIG. 15 may be regarded as a schematic drawing in a step subsequent to FIG. 7, but not limited thereto. As shown in FIGS. 16-18, the manufacturing method in this embodiment may include forming a fourth portion P4 of the bit line contact opening CH in the substrate 10 before the bit line contact structure 42C is formed. The fourth portion P4 is located under and connected with the third portion P3, and the bit line contact structure 42C is further formed in the fourth portion P4 of the bit line contact opening CH. A method of forming the fourth portion P4 of the bit line contact opening CH may include but is not limited to the following steps. As shown in FIG. 7 and FIG. 15, a third spacer (such as a spacer 36) may be formed after the third portion P3 of the bit line contact opening CH is formed. The spacer 36 may be partly formed on the spacer 34 and partly formed in the third portion P3 of the bit line contact opening CH. In some embodiments, the spacer 36 may be formed by forming a spacer material layer conformally on the mask layer 26 and the spacer 34 and conformally in the bit line contact opening CH and performing an etching back process to this spacer material layer for removing the spacer material layer formed on the mask layer 26 and removing a part of the spacer material layer formed in the bit line contact opening CH, but not limited thereto. The spacer 36 may also be formed by other suitable approaches according to some design considerations in the present invention. The spacer 36 may include a single layer or multiple layers of insulation materials, such as an oxide insulation material, a nitride insulation material, an oxynitride insulation material, or other suitable insulation materials. The material composition of the spacer 36 may be identical to or different from the material composition of the spacer 34 according to some design considerations.

As shown in FIG. 15 and FIG. 16, a third removing process 93 using the spacer 36 as a mask may be performed to at least a part of the substrate 10 for removing a part of the substrate 10 and forming the fourth portion P4 of the bit line contact opening CH. Because of the influence of the spacer 36, a width W4 of the fourth portion P4 may be less than the width W3 of the third portion P3. In some embodiments, the third removing process 93 may include an etching process or other suitable removing approaches, the spacer 36, the spacer 34, the spacer 32, and/or the mask layer 26 may be regarded as an etching mask in this etching process, and the fourth portion P4 of the bit line contact opening CH may be formed self-aligned accordingly, but not limited thereto. As shown in FIGS. 16-18, after the fourth portion P4 of the bit line contact opening CH is formed, the bit line contact structure 42C may be formed in the bit line contact opening CH, and the bit line structure BL and the spacer 52 described above may be formed. Therefore, in the memory device 103, the bit line contact opening CH may further include the fourth portion P4 located under the third portion P3 and connected with the third portion P3, and the bit line contact structure 42C may be further disposed in the fourth portion P4 of the bit line contact opening CH. The width W4 of the fourth portion P4 may be less than the width W1 of the first portion P1, the width W2 of the second portion P2, and/or the width W3 of the third portion P3, and the first portion P1, the second portion P2, the third portion P3, and the fourth portion P4 of the bit line contact opening CH may include a ladder-shaped structure at an inner wall of the bit lint contact opening CH. In addition, the memory device 103 may further include the third spacer (such as the spacer 36) disposed in the bit line contact opening CH and surrounding the bit line contact structure 42C. The spacer 36 is partly disposed on the spacer 32 and the spacer 34, at least a part of the spacer 36 is disposed in the third portion P3 of the bit line contact opening CH, and a bottom surface of the spacer 36 (such as the bottom surface BS3) is higher than a bottom surface BS4 of the fourth portion P4 in the vertical direction D3. The spacer 36 may be disposed in the first portion P1, the second portion P2, and the third portion P3 of the bit line contact opening CH, and the spacer 36 is not disposed in the fourth portion P4 of the bit line contact opening CH, but not limited thereto.

Figure 19:
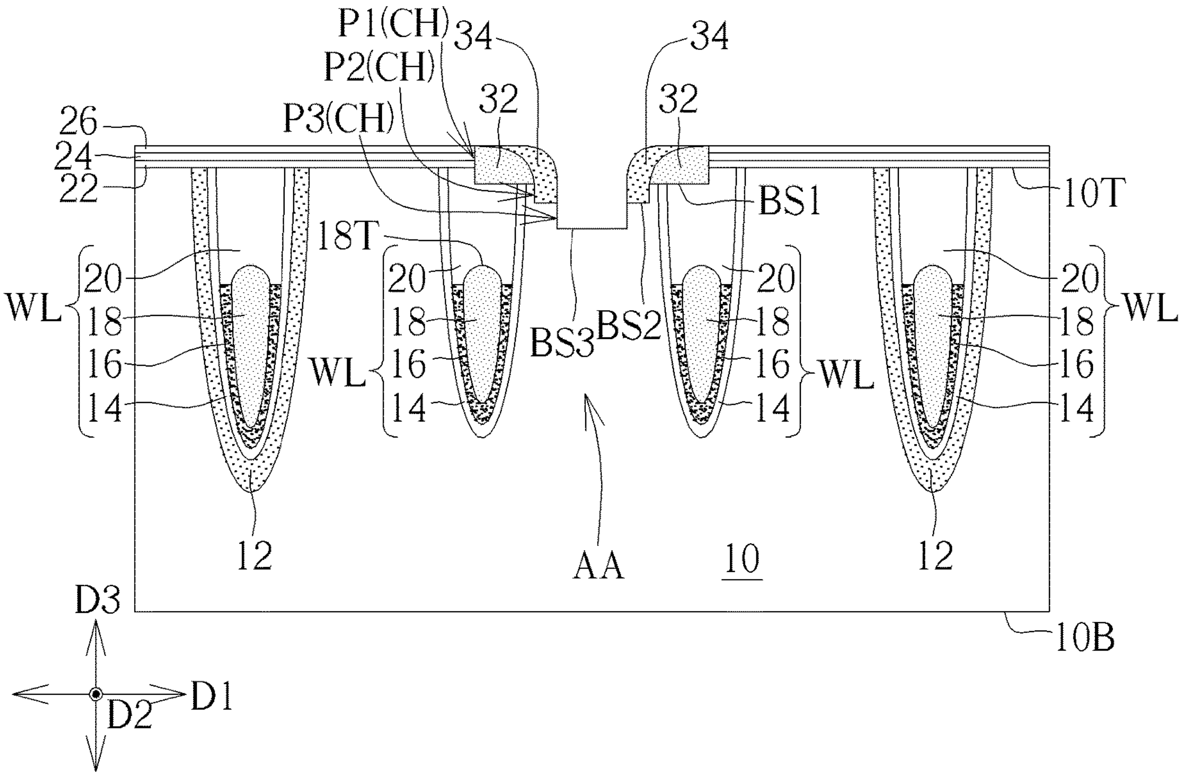
Figure 20:
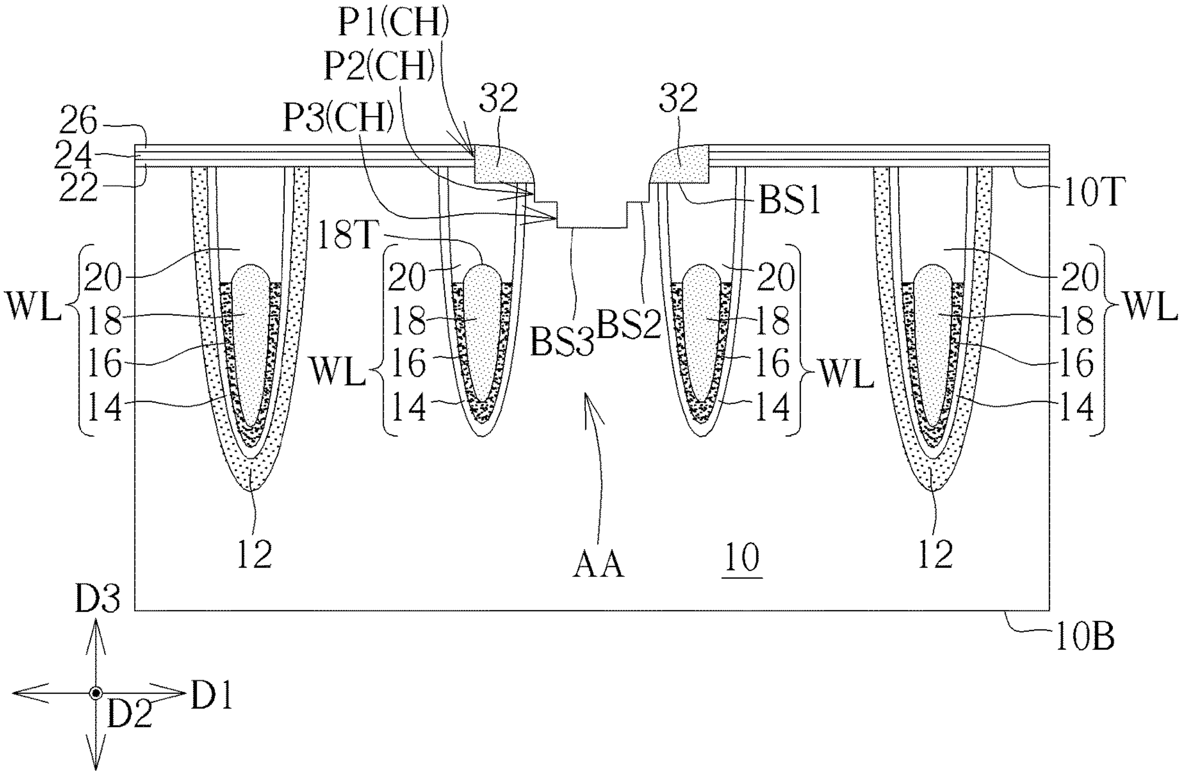
Figure 21:
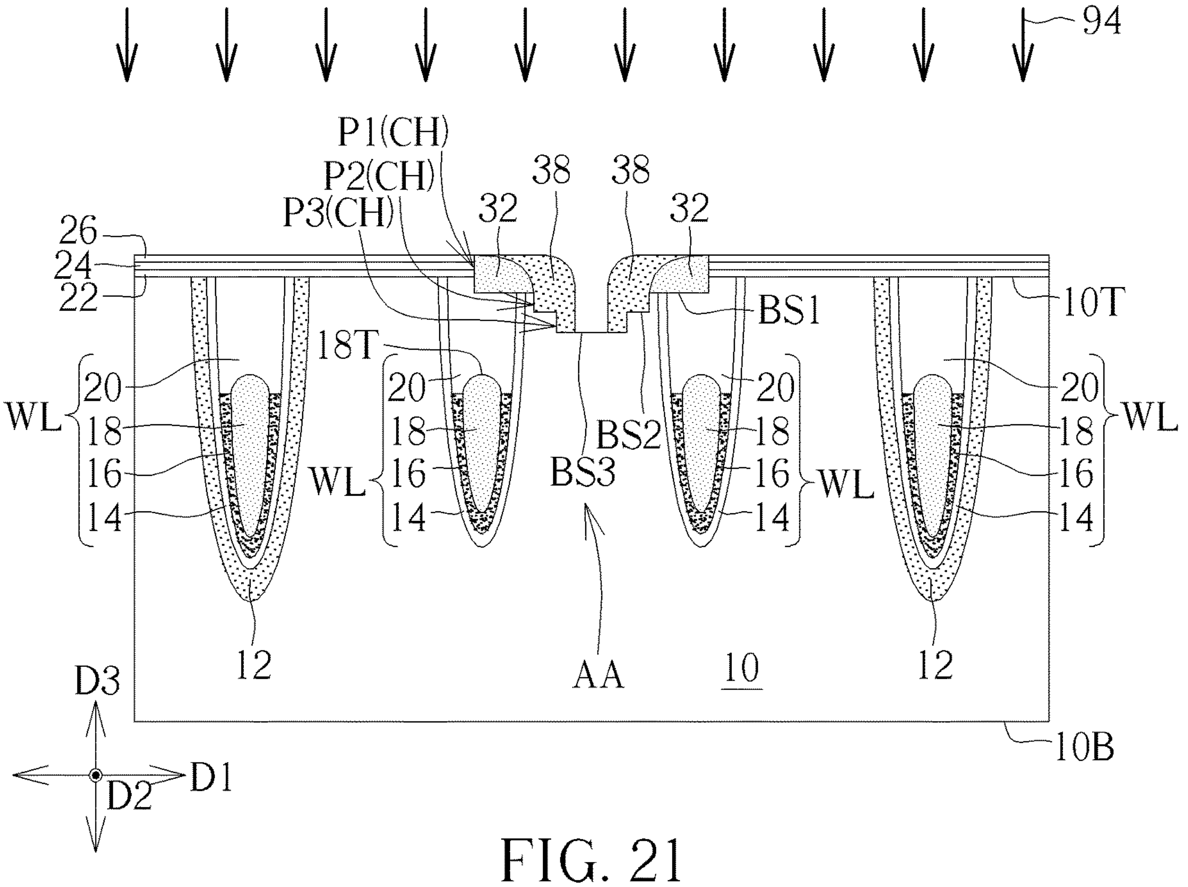
Figure 22:
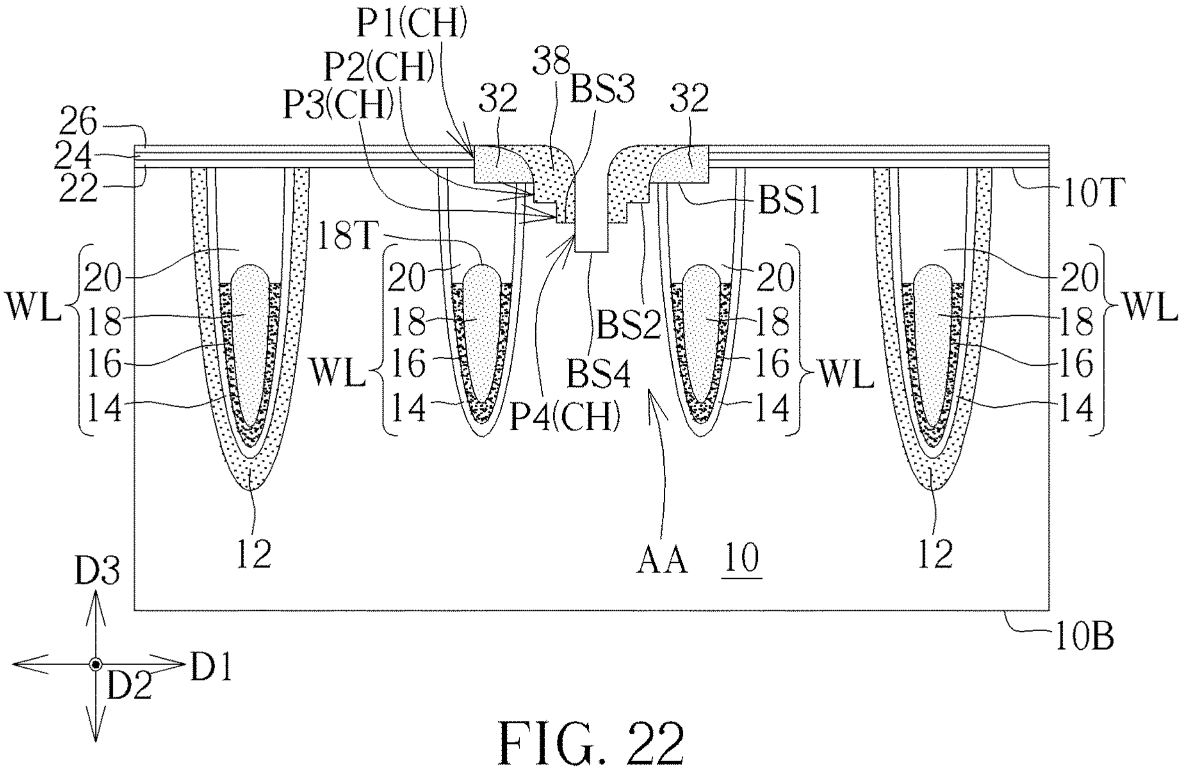
Figure 23:
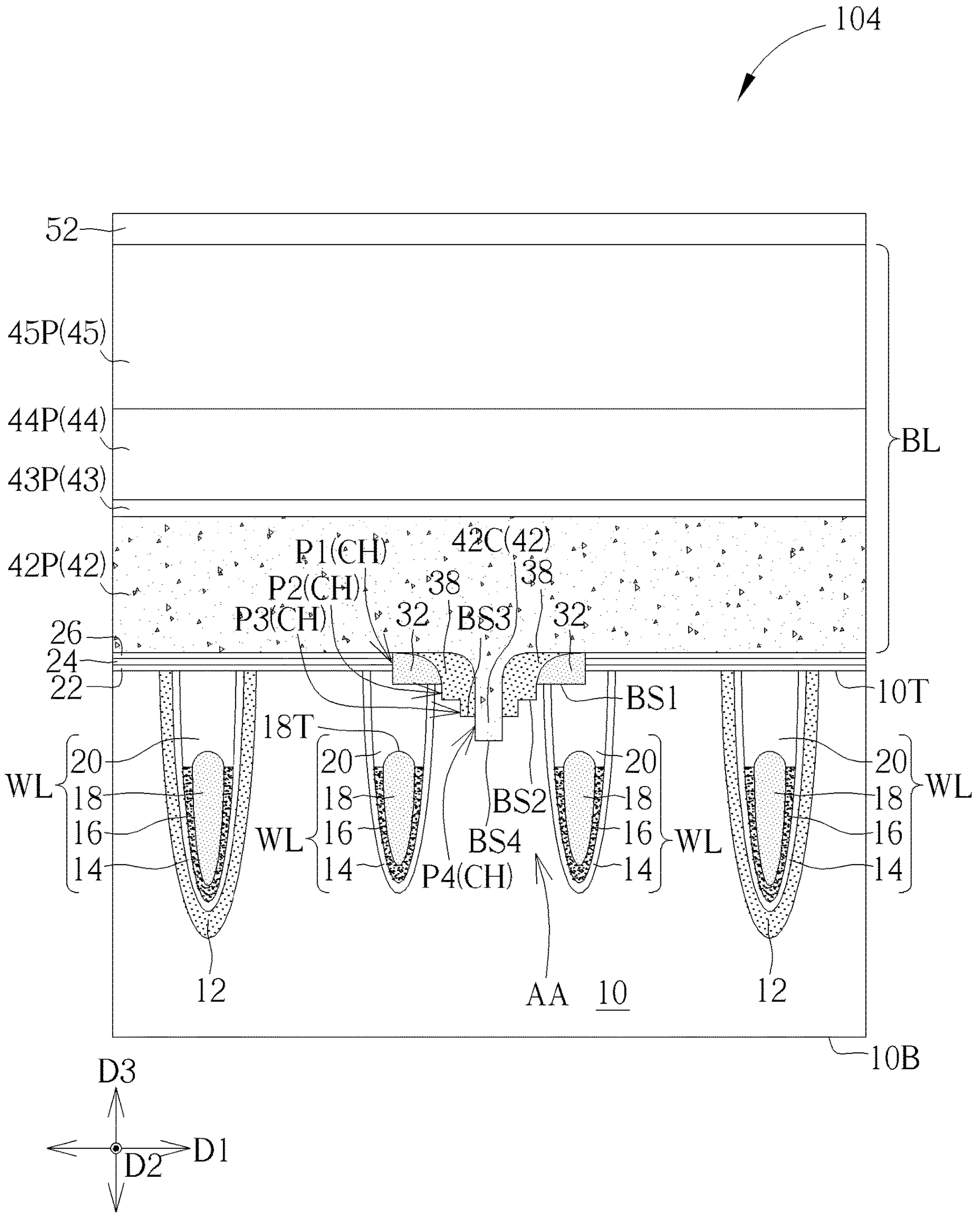
Figure 24:
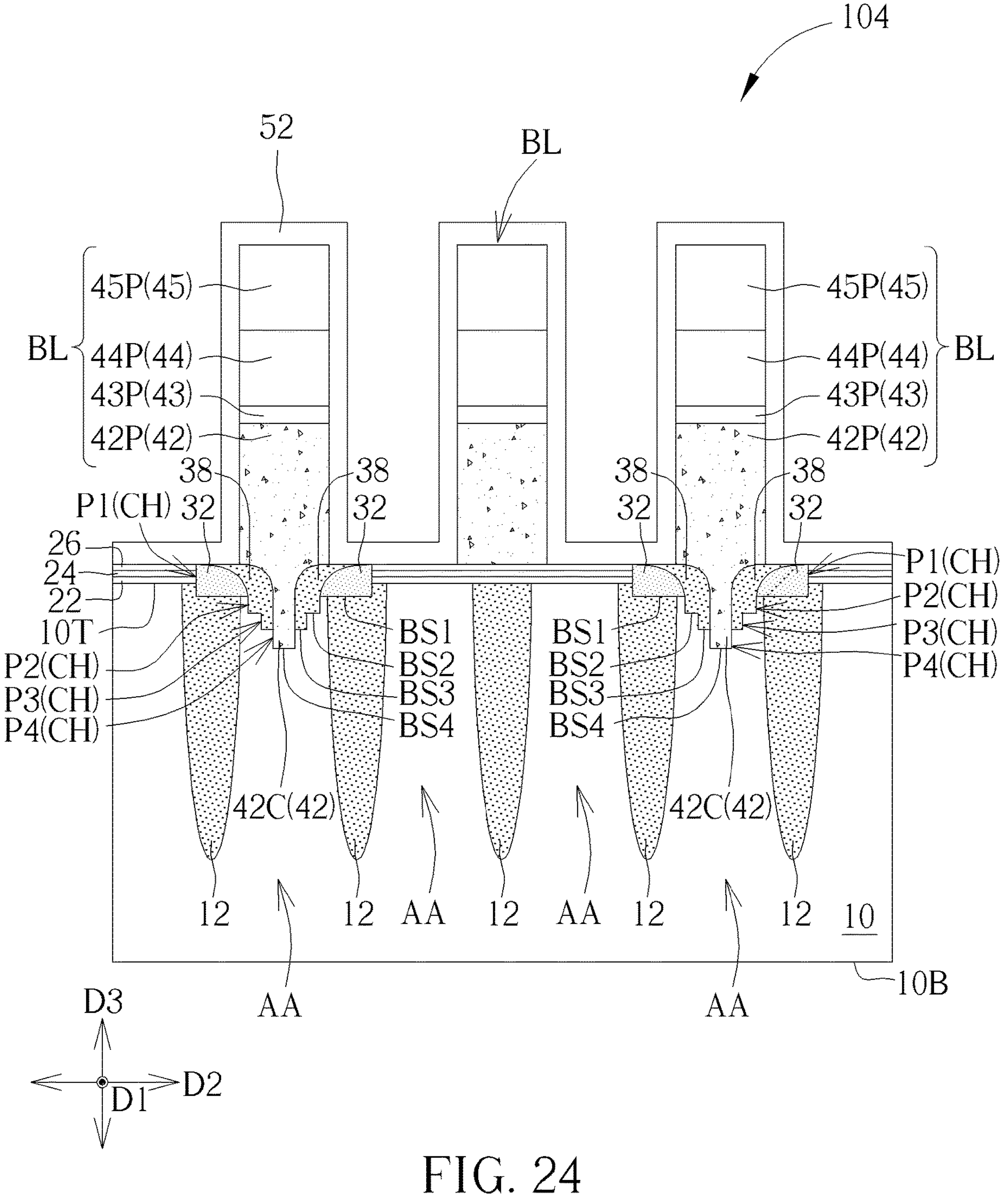

Please refer to FIGS. 19-24. FIGS. 19-24 are schematic drawings illustrating a manufacturing method of a memory device 104 according to a fourth embodiment of the present invention, wherein FIG. 20 is a schematic drawing in a step subsequent to FIG. 19, FIG. 21 is a schematic drawing in a step subsequent to FIG. 20, FIG. 22 is a schematic drawing in a step subsequent to FIG. 21, FIG. 23 is a schematic drawing in a step subsequent to FIG. 22, and FIG. 24 is a cross-sectional schematic drawing taken in another direction under the situation of FIG. 23. As shown in FIG. 19 and FIG. 20, the spacer 34 may be removed after the third portion P3 of the bit line contact opening CH is formed. Subsequently, as shown in FIG. 20 and FIG. 21, a fourth spacer (such as a spacer 38) may be formed after the spacer 34 is removed. The spacer 38 may be partly formed on the spacer 32 and partly formed in the second portion P2 and the third portion P3 of the bit line contact opening CH. In some embodiments, the spacer 38 may be formed by forming a spacer material layer conformally on the mask layer 26 and the spacer 32 and conformally in the bit line contact opening CH and performing an etching back process to this spacer material layer for removing the spacer material layer formed on the mask layer 26 and removing a part of the spacer material layer formed in the bit line contact opening CH, but not limited thereto. The spacer 38 may also be formed by other suitable approaches according to some design considerations in the present invention. The spacer 38 may include a single layer or multiple layers of insulation materials, such as an oxide insulation material, a nitride insulation material, an oxynitride insulation material, or other suitable insulation materials. The material composition of the spacer 38 may be identical to or different from the material composition of the spacer 32 according to some design considerations.

As shown in FIG. 21 and FIG. 22, a fourth removing process 94 using the spacer 38 as a mask may be performed to at least a part of the substrate 10 for removing a part of the substrate 10 and forming the fourth portion P4 of the bit line contact opening CH. Because of the influence of the spacer 38, the width W4 of the fourth portion P4 may be less than the width W3 of the third portion P3. In some embodiments, the fourth removing process 94 may include an etching process or other suitable removing approaches, the spacer 38, the spacer 32, and/or the mask layer 26 may be regarded as an etching mask in this etching process, and the fourth portion P4 of the bit line contact opening CH may be formed self-aligned accordingly, but not limited thereto. As shown in FIGS. 22-24, after the fourth portion P4 of the bit line contact opening CH is formed, the bit line contact structure 42C may be formed in the bit line contact opening CH, and the bit line structure BL and the spacer 52 described above may be formed. Therefore, the memory device 104 may further include the spacer 38 disposed in the bit line contact opening CH and surrounding the bit line contact structure 42C. The spacer 38 may be disposed in the second portion P2 and the third portion P3 of the bit line contact opening CH and contact the bottom surface BS2 of the second portion P2 and the bottom surface BS3 of the third portion P3. A bottom surface of the spacer 38 may be higher than the bottom surface BS4 of the fourth portion P4 in the vertical direction D3, and the spacer 38 is not disposed in the fourth portion P4 of the bit line contact opening CH, but not limited thereto.

Figure 25:
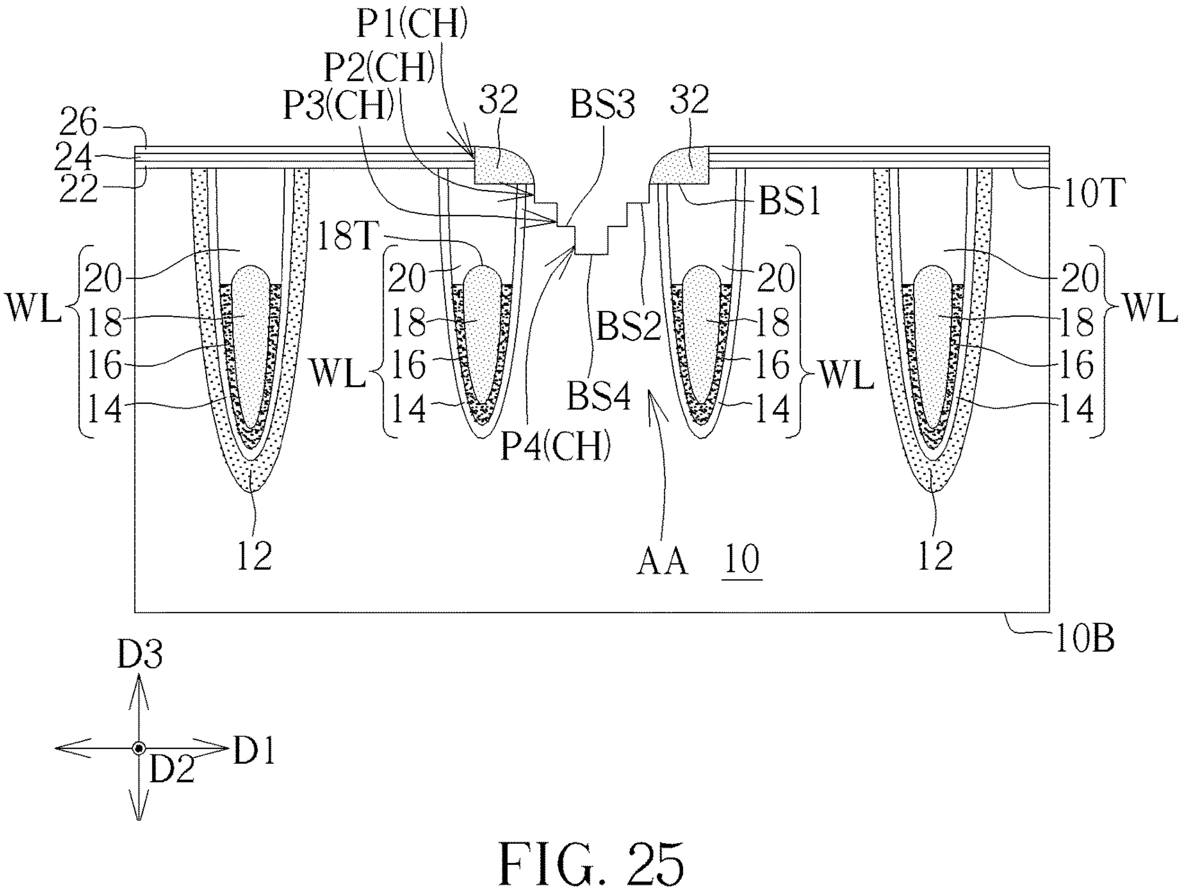
Figure 26:
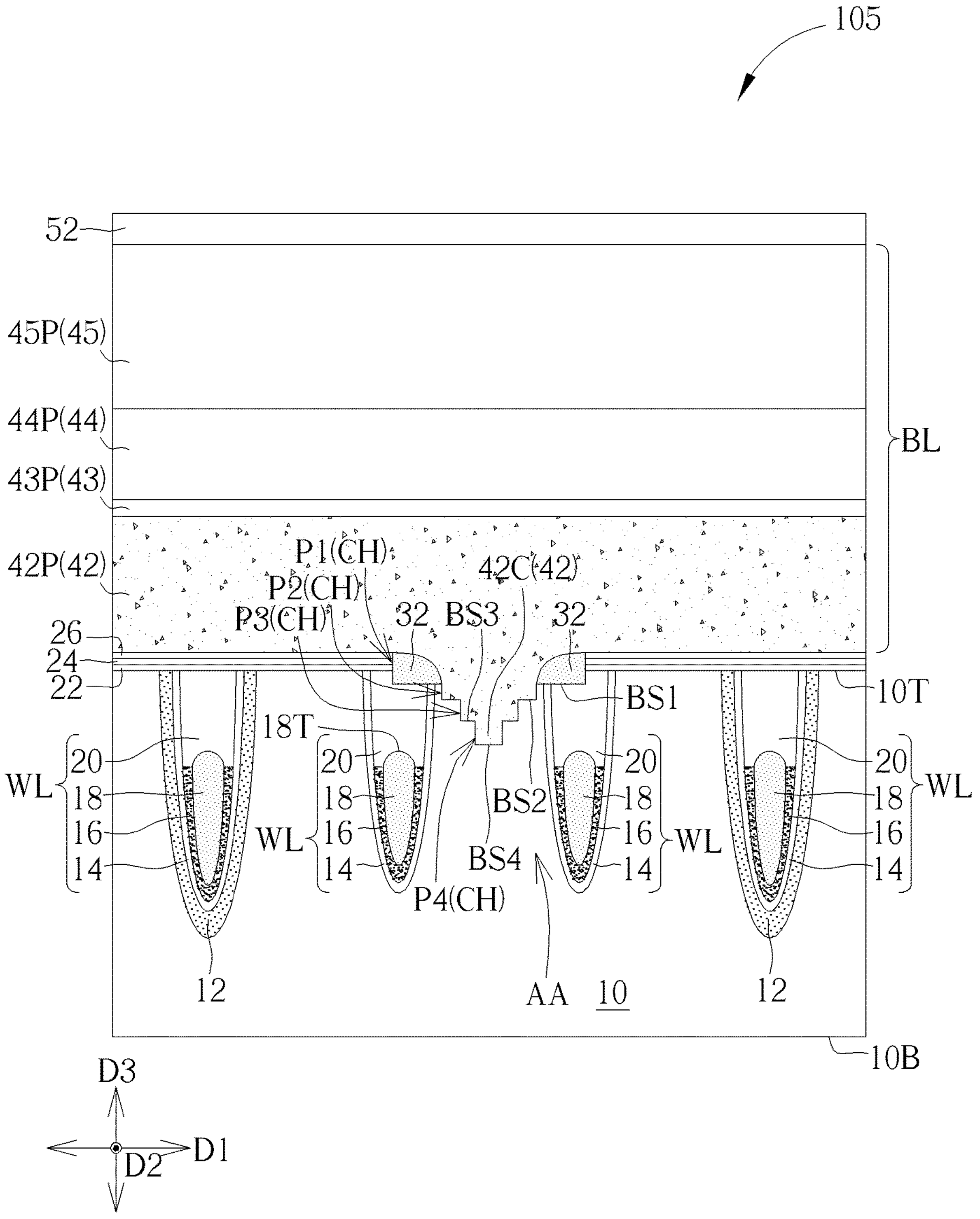
Figure 27:
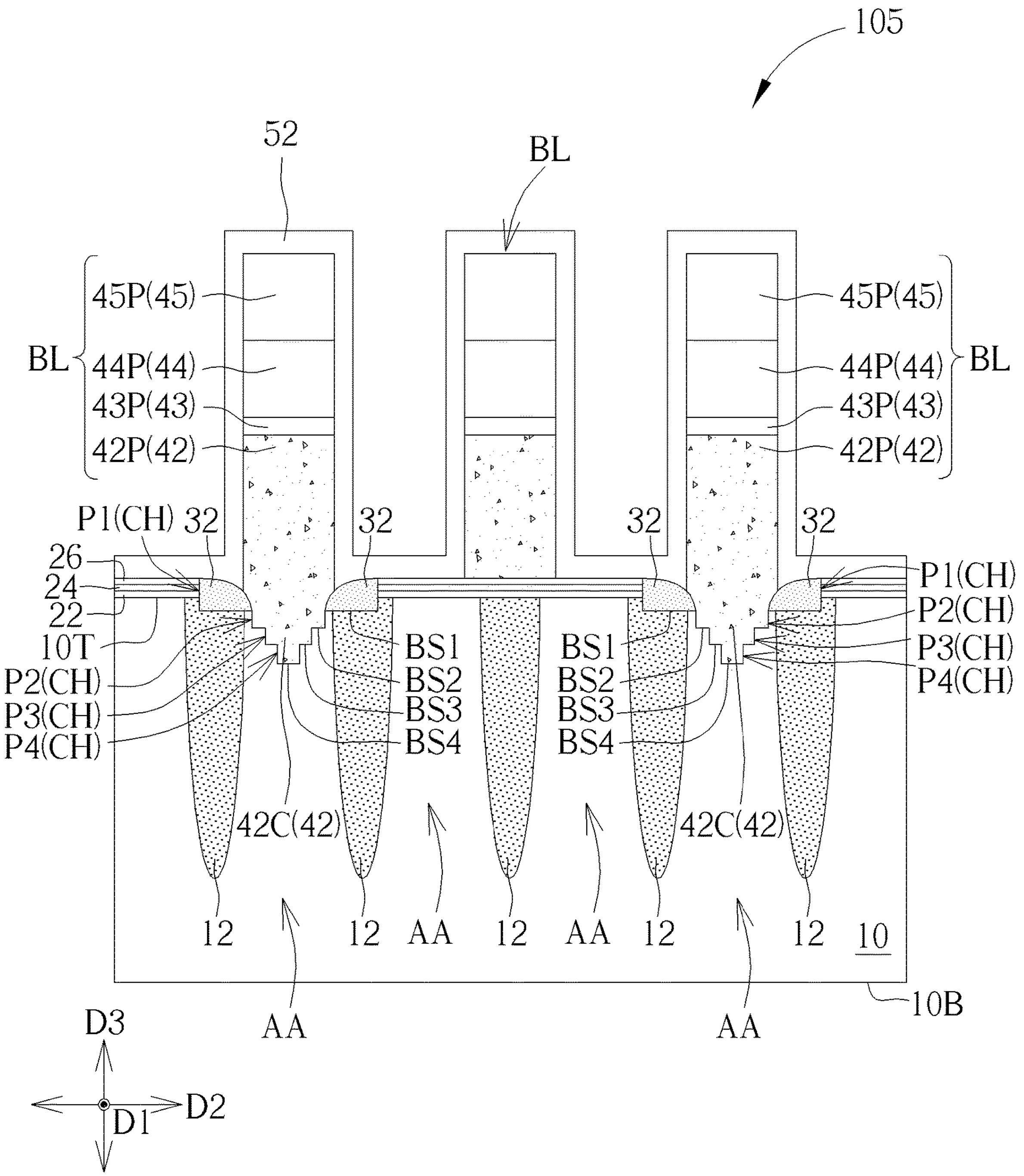

Please refer to FIGS. 25-27 and FIG. 16. FIGS. 25-27 are schematic drawings illustrating a manufacturing method of a memory device 105 according to a fifth embodiment of the present invention, wherein FIG. 26 is a schematic drawing in a step subsequent to FIG. 25, and FIG. 27 is a cross-sectional schematic drawing taken in another direction under the situation of FIG. 26. In some embodiments, FIG. 25 may be regarded as a schematic drawing in a step subsequent to FIG. 16, but not limited thereto. As shown in FIG. 16 and FG. 25, after the fourth portion P4 of the bit line contact opening CH is formed, the spacer 34 and the spacer 36 may be removed. Subsequently, as shown in FIG. 26 and FIG. 27, the bit line contact structure 42C may be formed in the bit line contact opening CH, and the bit line structure BL and the spacer 52 described above may be formed. In other words, the spacer 34 and the spacer 36 may be removed before the bit line contact structure 42C is formed. In the memory device 105, the bit line contact structure 42C may contact the bottom surface BS2 of the second portion P2, the bottom surface BS3 of the third portion P3, and the bottom surface BS4 of the fourth portion P4, and the bit line contact structure 42C may include a ladder-shaped structure accordingly, such as a ladder-shaped structure at the sidewall of the lower portion of the bit line contact structure 42C.

To summarize the above descriptions, in the memory device and the manufacturing method thereof according to the present invention, the spacer may be disposed in the first portion of the bit line contact opening and surround the bit line contact structure, and other portions of the bit line contact opening located under the first portion of the bit line contact opening may be far from the word line structure by the manufacturing method of the present invention. The influence of the alignment shift or the process variations in the step of forming the bit line structure and the bit line contact structure may be improved accordingly, and the production yield may be enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:

a substrate comprising a shallow trench isolation and an active region;

a mask layer disposed on the substrate;

a first spacer disposed in the substrate and penetrating through the mask layer;

a bit line contact structure disposed in the substrate, wherein the bit line contact structure penetrates through the first spacer and is in contact with the active region, and the bit line contact structure comprises a lower portion and an upper portion on the lower portion, wherein a width of the upper portion is greater than a width of the lower portion; and a bit line structure disposed on the bit line contact structure and being in contact with the bit line contact structure, wherein a bottom surface of the first spacer is higher than a top surface of the lower portion in a vertical direction, and a projection of the bit line structure in the vertical direction partially overlaps a projection of the first spacer in the vertical direction.

2. The memory device according to claim 1, wherein the bit line contact structure comprises a ladder-shaped structure at a sidewall of the lower portion and a sidewall of the upper portion.

3. The memory device according to claim 1, wherein a bottom surface of the upper portion is lower than the bottom surface of the first spacer in the vertical direction.

4. The memory device according to claim 1, wherein a part of the upper portion is disposed directly above the first spacer in the vertical direction.

5. The memory device according to claim 1, further comprising:

a second spacer, wherein the first spacer is between the second spacer and the mask layer.

6. The memory device according to claim 5, wherein a bottom surface of the second spacer is lower than the bottom surface of the first spacer.

7. The memory device according to claim 1, further comprising:

a bit line spacer disposed on a sidewall of the bit line structure and a top surface of the first spacer.

8. A memory device, comprising:

a substrate;

a mask layer disposed on the substrate;

stacked spacers disposed in the substrate and penetrating through the mask layer, wherein the stacked spacers comprises an inner spacer and an outer spacer at outside of the inner spacer, and a bottom surface of the inner spacer is lower than a bottom surface of the outer spacer;

a bit line contact structure disposed in the substrate, wherein the bit line contact structure penetrates through the stacked spacers; and a bit line structure disposed on the bit line contact structure and being in contact with the bit line contact structure, wherein a width of a bottommost portion of the bit line contact structure is less than a width of a topmost portion of the bit line contact structure, and a part of the inner spacer is disposed directly above the outer spacer in a vertical direction.

9. The memory device according to claim 8, wherein a part of the topmost portion of the bit line contact structure is disposed directly above the inner spacer in the vertical direction.

10. The memory device according to claim 8, further comprising:

a word line structure disposed in the substrate, wherein a part of the substrate is sandwiched between the inner spacer and the word line structure in a horizontal direction.

11. The memory device according to claim 8, wherein the stacked spacers further comprises an innermost spacer disposed between the inner spacer and the bit line contact structure, wherein a bottom surface of the innermost spacer is lower than the bottom surface of the inner spacer.

12. The memory device according to claim 11, wherein a part of the innermost spacer is disposed directly above the inner spacer in a vertical direction.

13. A memory device, comprising:

a substrate comprising a shallow trench isolation and an active region;

a mask layer disposed on the substrate;

a first spacer disposed in the substrate and penetrating through the mask layer;

a bit line contact structure disposed in the substrate, wherein the bit line contact structure penetrates through the spacer and is in contact with the active region;

a bit line structure disposed on the bit line contact structure and being in contact with the bit line contact structure, wherein a bottommost surface of the first spacer is higher than a bottommost surface of the bit line contact structure in a vertical direction, and a projection of the bit line structure in the vertical direction partially overlaps a projection of the first spacer in the vertical direction; and a bit line spacer disposed on a sidewall of the bit line structure and a top surface of the first spacer.

14. The memory device according to claim 13, wherein the bit line spacer is further disposed on the mask layer.

15. The memory device according to claim 13, wherein the bit line contact structure comprises a ladder-shaped structure.

16. The memory device according to claim 13, further comprising:

a second spacer, wherein the first spacer is between the second spacer and the mask layer.

17. The memory device according to claim 16, wherein a bottom surface of the second spacer is lower than the bottom surface of the first spacer.

* * * * *